(12) United States Patent
op 't Root et al.

(10) Patent No.: US 10,451,890 B2
(45) Date of Patent: Oct. 22, 2019

(54) REDUCING SPECKLE IN AN EXCIMER LIGHT SOURCE

(71) Applicants: Cymer, LLC, San Diego, CA (US); ASML Netherlands B.V., Veldhoven (NL)

(72) Inventors: Wilhelmus Patrick Elisabeth Maria op 't Root, Nederweert (NL); Thomas Patrick Duffey, San Diego, CA (US); Herman Philip Godfried, Amsterdam (NL); Frank Everts, Eindhoven (NL); Joshua Jon Thornes, San Diego, CA (US); Brian Edward King, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/407,153

(22) Filed: Jan. 16, 2017

(65) Prior Publication Data

US 2018/0203248 A1 Jul. 19, 2018

(51) Int. Cl.
*G01J 3/02* (2006.01)
*G01J 3/26* (2006.01)
(Continued)

(52) U.S. Cl.
CPC ............. *G02B 27/48* (2013.01); *G01J 3/027* (2013.01); *G01J 3/26* (2013.01); *G01J 9/02* (2013.01);
(Continued)

(58) Field of Classification Search
CPC . G03B 27/0933; G03B 27/0944; G01J 11/00; G01J 3/00; G01J 9/00;
(Continued)

(56) References Cited

U.S. PATENT DOCUMENTS

| 5,852,621 A | 12/1998 | Sandstrom |
| 6,704,339 B2 | 3/2004 | Lublin et al. |

(Continued)

FOREIGN PATENT DOCUMENTS

WO 2016045897 A1 3/2016

OTHER PUBLICATIONS

Lee W. Young, U.S. International Searching Authority, International Search Report and Written Opinion, counterpart PCT Application No. PCT/US17/64556, dated Mar. 9, 2018, 10 pages total.
(Continued)

*Primary Examiner* — William R Alexander
(74) *Attorney, Agent, or Firm* — DiBerardino McGovern IP Group LLC

(57) ABSTRACT

A method includes: producing a light beam made up of pulses having a wavelength in the deep ultraviolet range, each pulse having a first temporal coherence defined by a first temporal coherence length and each pulse being defined by a pulse duration; for one or more pulses, modulating the optical phase over the pulse duration of the pulse to produce a modified pulse having a second temporal coherence defined by a second temporal coherence length that is less than the first temporal coherence length of the pulse; forming a light beam of pulses at least from the modified pulses; and directing the formed light beam of pulses toward a substrate within a lithography exposure apparatus.

42 Claims, 14 Drawing Sheets

(51) Int. Cl.
*G01J 9/02* (2006.01)
*G02F 1/01* (2006.01)
*G03F 7/20* (2006.01)
*H01S 3/00* (2006.01)
*H01S 4/00* (2006.01)
*G01J 11/00* (2006.01)
*G02B 19/00* (2006.01)
*G02B 27/48* (2006.01)

(52) U.S. Cl.
CPC ............ *G01J 11/00* (2013.01); *G02F 1/0121* (2013.01); *G03F 7/70008* (2013.01); *G03F 7/70041* (2013.01); *G03F 7/7055* (2013.01); *H01S 4/00* (2013.01); *G01J 2009/0211* (2013.01); *G02B 19/0095* (2013.01); *G02F 2203/18* (2013.01); *G03F 7/70025* (2013.01); *G03F 7/70583* (2013.01); *H01S 3/0057* (2013.01)

(58) Field of Classification Search
CPC ........ G01J 2009/006; G01J 3/027; G01J 3/26; G01J 9/02; G01J 2009/0211; H01S 3/0057; H01S 3/0092; H01S 3/02; H01S 3/05; H01S 3/10; H01S 3/13; H01S 3/30; H01S 4/00; G02F 1/01; G02F 1/03; G02F 1/0121; G02F 2203/18; G01N 21/00; G01B 9/02009; G01B 9/02014; G03F 7/70; G03F 7/70025; G03F 7/70041; G03F 7/70516; G03F 7/70583; G03F 7/70008; G03F 7/7055; G02B 27/48; G02B 19/0095
USPC ....... 359/237–239, 257, 264, 278, 279, 285, 359/559; 356/51, 308, 309, 451, 456, 356/479, 480, 496, 497; 250/372, 373; 372/21, 22, 25, 26, 29.016, 29.021, 372/29.023, 30, 102
See application file for complete search history.

(56) References Cited

U.S. PATENT DOCUMENTS

| 6,737,662 | B2 | 5/2004 | Mulder et al. |
| 7,365,859 | B2* | 4/2008 | Yun .................... G01N 21/4795 356/479 |
| 7,567,607 | B2 | 7/2009 | Knowles et al. |
| 7,643,529 | B2* | 1/2010 | Brown ................ G03F 7/70025 372/55 |
| 7,715,459 | B2 | 5/2010 | Brown et al. |
| 7,728,954 | B2 | 6/2010 | Baselmans et al. |
| 7,728,955 | B2* | 6/2010 | Munnig Schmidt ......................... G03F 7/70291 355/69 |
| 7,778,302 | B2 | 8/2010 | Ershov et al. |
| 7,804,603 | B2 | 9/2010 | Klarenbeek |
| 7,822,092 | B2 | 10/2010 | Ershov et al. |
| 7,885,309 | B2* | 2/2011 | Ershov .................... H01S 3/225 372/57 |
| 7,920,616 | B2 | 4/2011 | Brown et al. |
| 7,999,915 | B2 | 8/2011 | Ershov et al. |
| 8,014,432 | B2 | 9/2011 | Ye et al. |
| 8,089,672 | B2 | 1/2012 | Tinnemans et al. |
| 8,144,740 | B1* | 3/2012 | Brown ................ G03F 7/70025 372/32 |
| 8,170,078 | B2 | 5/2012 | Ershov et al. |
| 8,320,056 | B2 | 11/2012 | Erlandson |
| 8,432,529 | B2 | 4/2013 | Claessens et al. |
| 8,508,716 | B2 | 8/2013 | Claessens et al. |
| 8,675,699 | B2* | 3/2014 | Dantus .................... G01J 11/00 372/25 |
| 8,937,706 | B2 | 1/2015 | Mulder et al. |
| 8,964,798 | B2* | 2/2015 | Armstrong ................ H01S 3/10 372/102 |
| 9,184,555 | B2 | 11/2015 | Yoshino et al. |
| 9,209,589 | B2* | 12/2015 | Armstrong ................ H01S 3/10 |
| 9,360,762 | B2 | 6/2016 | Tychkov |
| 9,562,759 | B2* | 2/2017 | Vogler .................... A61B 3/102 |
| 2007/0008609 | A1 | 1/2007 | Ohtsuki et al. |
| 2007/0222961 | A1 | 9/2007 | Schmidt |
| 2009/0213350 | A1 | 8/2009 | Sogard |
| 2011/0211184 | A1 | 9/2011 | Tokuhisa et al. |
| 2015/0286144 | A1 | 10/2015 | Zeng et al. |

OTHER PUBLICATIONS

Murray et al., "Spatial Filter Issues," UCRL-JC-129751, Third Annual International Conference on Solid State Lasers for Application (SSLA) to Inertial Confinement Fusion (ICF), Monterey, CA, Jun. 7-12, 1998, Lawrence Livermore National Laboratory, 10 pages,1998, accessed from https://e-reports-ext.llnl.gov/pdf/234700.pdf.

Nixon et al., "Efficient method for controlling the spatial coherence of a laser," Department of Physics of Complex Systems, Weizmann Institute of Science, Rehovot, Israel, Department of Applied Physics, Yale University, New Haven, CT, Optical Society of America, Optics Letters, vol. 38, No. 19, Oct. 1, 2013, pp. 3858-3861 (4 total pages), http://dx.doi.org/10.1364/0L.38.003858.

Noordman et al., "Speckle in optical lithography and the influence on line width roughness," ASML Netherlands B.V., Veldhoven, The Netherlands, ASML Wilton, Wilton, CT, Carl Zeiss SMT AG, Oberkochen, Germany, Proc. of SPIE vol. 7274, 72741R1-72741R12 (12 total pages), Optical Microlithography XXII, Mar. 16, 2009, doi: 10.1117/12.814169.

Pate,"Fly's Eye Arrays for Uniform Illumination in Digital Projector Optics," White Paper, Zemax, LLC, A Radiant Zemax Company, 9 pages, 2013, 770-9002-01 1/13.

Office Action, counterpart Taiwanese Patent Application No. 107101139, dated Oct. 23, 2018, 17 pages total (including English translation of 7 pages).

* cited by examiner

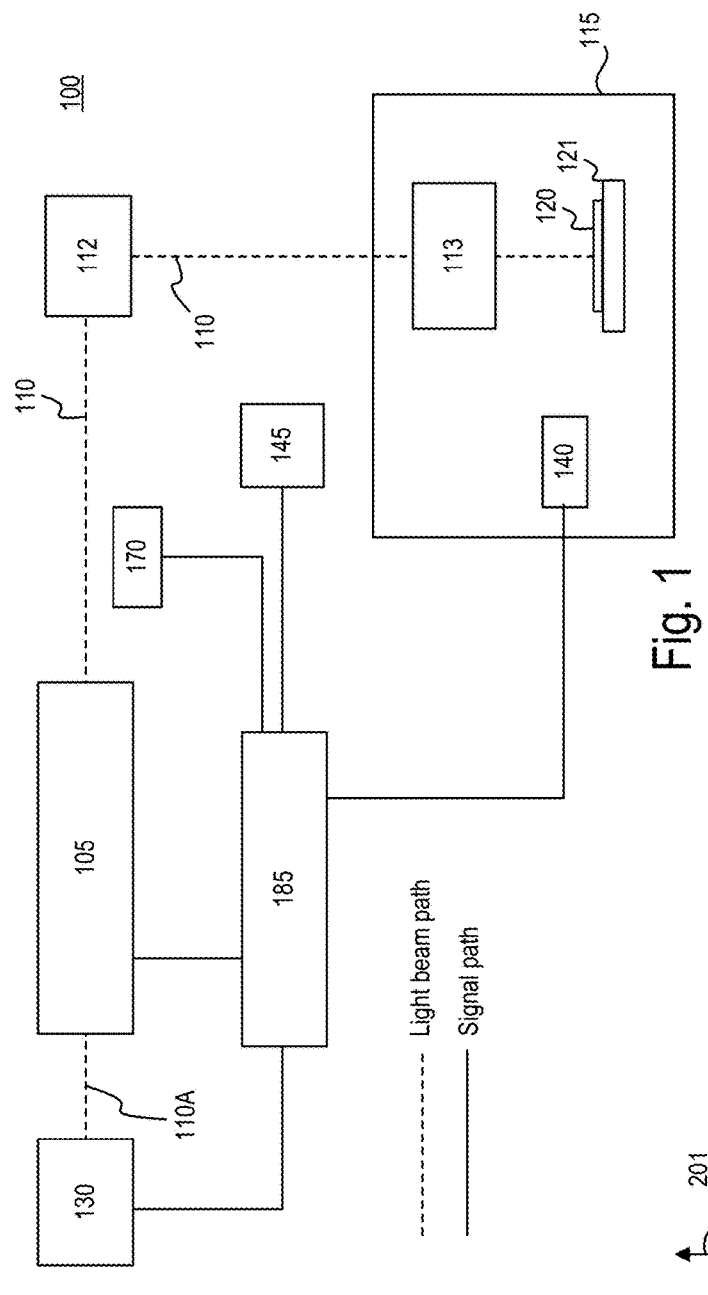

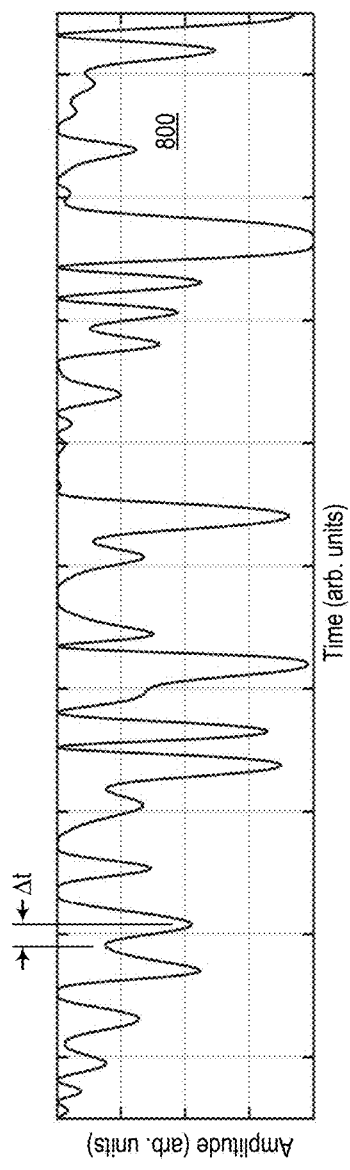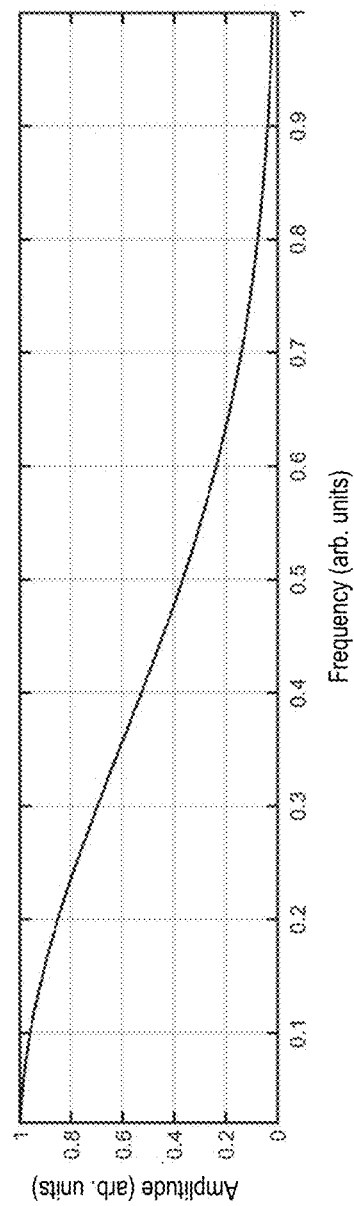

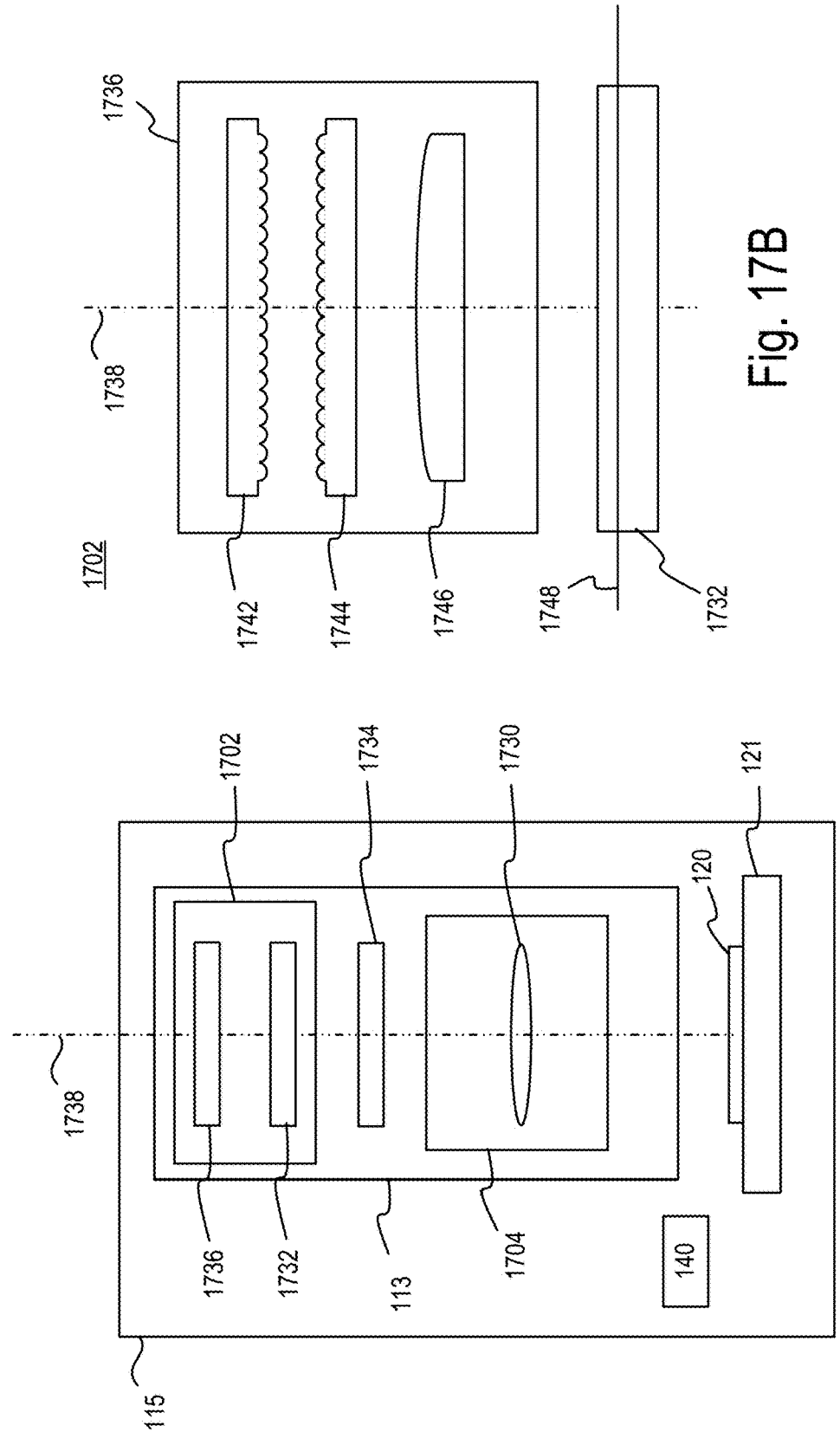

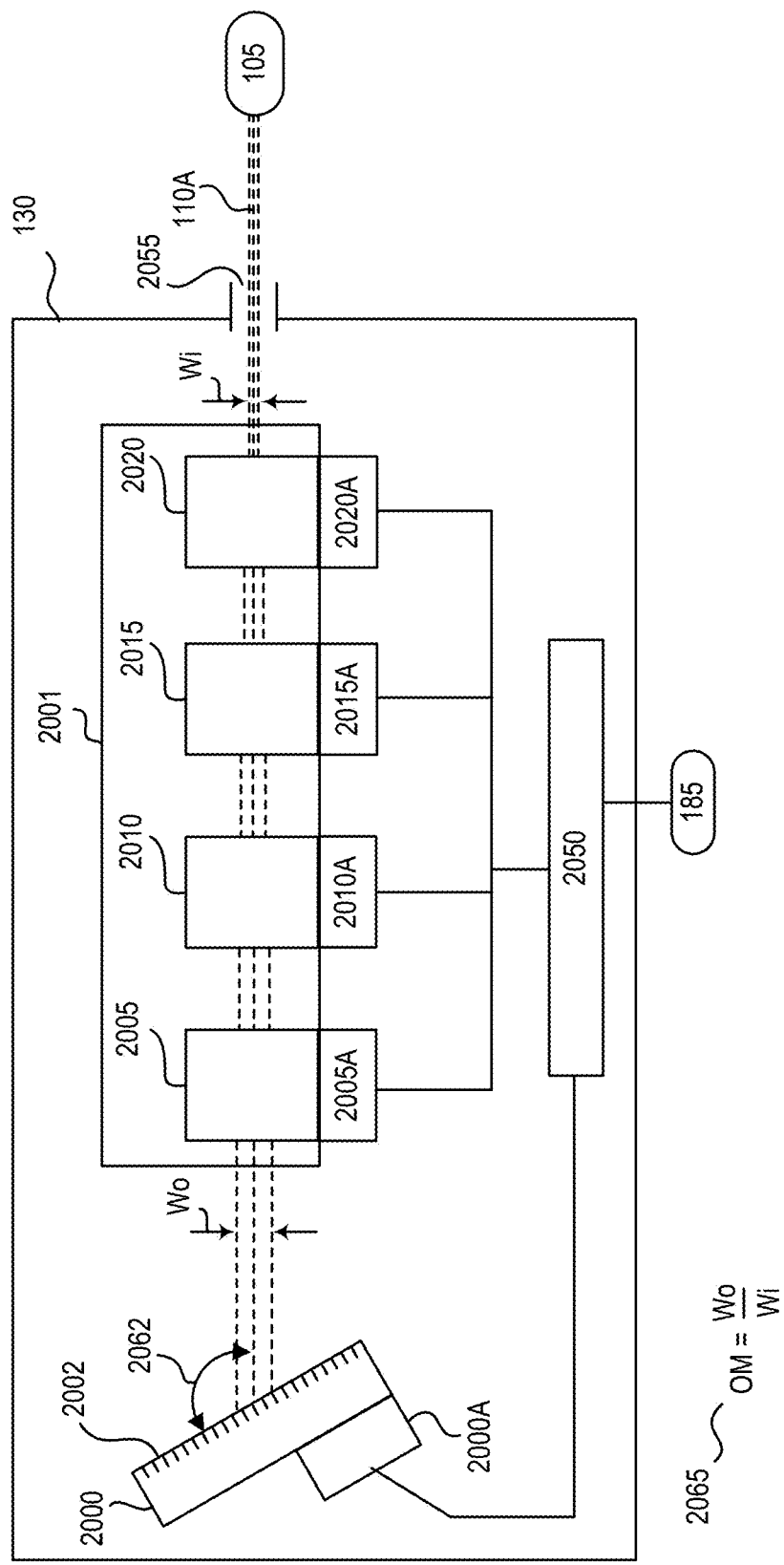

REDUCING SPECKLE IN AN EXCIMER LIGHT SOURCE

TECHNICAL FIELD

The disclosed subject matter relates to an apparatus and method for reducing speckle in an excimer light source, for example, a deep ultraviolet (DUV) light source for semiconductor lithography.

BACKGROUND

In semiconductor lithography (or photolithography), the fabrication of an integrated circuit (IC) includes performing a variety of physical and chemical processes on a semiconductor (for example, silicon) substrate (which is also referred to as a wafer). A photolithography exposure apparatus or scanner is a machine that applies a desired pattern onto a target portion of the substrate. The wafer is irradiated by a light beam that extends along an axial direction, and the wafer is fixed to a stage so that the wafer generally extends along a lateral plane that is substantially orthogonal to the axial direction. The light beam has a wavelength in the deep ultraviolet (DUV) range, for example, from about 10 nanometers (nm) to about 400 nm.

SUMMARY

In some general aspects, a method includes producing a light beam made up of pulses having a wavelength in the deep ultraviolet range, with each pulse having a first temporal coherence defined by a first temporal coherence length and each pulse being defined by a pulse duration. For one or more pulses, the optical phase is modulated over the pulse duration of the pulse to produce a modified pulse having a second temporal coherence defined by a second temporal coherence length that is less than the first temporal coherence length of the pulse. The method includes forming a light beam of pulses at least from the modified pulses; and directing the formed light beam of pulses toward a substrate within a lithography exposure apparatus.

Implementations can include one or more of the following features. For example, the light beam made up of pulses can be produced by: producing a seed light beam made up of pulses; and producing a light beam made up of amplified pulses by optically amplifying the pulses of the seed light beam by repeatedly passing the pulses of the seed light beam through a resonator. The optical phase can be modulated over the pulse duration of a pulse by modulating the optical phase over the pulse duration of an amplified pulse to produce the modified pulse. The optical phase can be modulated over the pulse duration of a pulse by modulating the optical phase over the pulse duration of a pulse of the seed light beam to produce the modified pulse; and the light beam made up of amplified pulses can be produced by optically amplifying the modified pulses. The light beam of pulses formed from the modified pulses can be directed toward the substrate by directing the light beam made up of amplified pulses toward the substrate.

The method can also include reducing a bandwidth of a pulse of the light beam before modulating the optical phase over the pulse duration of that pulse to produce the modified pulse. The optical phase can be modulated over the pulse duration of a pulse to cause the bandwidth of the pulse to increase but remain within a range of a target bandwidth.

The optical phase can be modulated over the pulse duration of a pulse by convoluting the spectrum of the electric field of the pulse by a Fourier transform relating to modulating the optical phase over the pulse duration of the pulse. The optical phase can be modulated over the pulse duration of a pulse to thereby reduce a dynamic speckle contrast of the light beam of pulses directed toward the substrate.

The method can also include increasing a duration of the pulses in the light beam directed toward the substrate. The duration of the pulses in the light beam can be increased by: splitting the amplitude of each pulse of the light beam into split portions, introducing temporal delays among these split portions to produce temporally-delayed portions of the pulse, and recombining these temporally-delayed portions of the pulse to provide a temporally stretched pulse of the light beam. The optical phase can be modulated over the pulse duration of a pulse by modulating the optical phase over the pulse duration of one or more split portions of the pulse.

The optical phase can be modulated over the pulse duration of a pulse to cause the bandwidth of the pulse of the light beam to increase.

The method can also include selecting a range of frequencies at which the optical phase over the pulse duration of a pulse is modulated.

The frequency range can be selected by: determining a target frequency range that would produce a target bandwidth of the modified pulse; and maintaining the frequency range within the determined target frequency range to thereby maintain the bandwidth of the modified pulse within a range of the target bandwidth. The method can include measuring a bandwidth of the pulse prior to modulating the optical phase over the pulse duration of the pulse to determine whether the modified pulse would have a bandwidth that is within a range of the target bandwidth. The method can include measuring a bandwidth of the modified pulse prior to modulating the optical phase over the pulse duration of the next pulse to determine whether the modified pulse has a bandwidth that is within a range of the target bandwidth. The method can include calculating the target bandwidth for a particular next pulse based on the measured bandwidth of a plurality of previously-modified pulses.

The frequency range can be selected by selecting the frequency range at which the optical phase over the pulse duration of a pulse is modulated for each pulse in the light beam.

The optical phase can be modulated over the pulse duration of a pulse by modulating a refractive index of a material through which the pulse is directed.

The method can include adjusting a bandwidth of the pulse that is directed toward the substrate by adjusting a rate at which the optical phase is modulated.

The method can include: estimating a bandwidth of the modified pulse; determining whether the estimated bandwidth is within a range of a target bandwidth; and if it is determined that the estimated bandwidth is outside the range of a target bandwidth, then adjusting a frequency range at which the optical phase is modulated to thereby adjust a bandwidth of the next modified pulse.

The optical phase can be modulated over the pulse duration of a pulse by randomizing the optical phase over the pulse duration of the pulse.

The optical pulse can be associated with a waveform, the waveform being represented by points in time, and the optical phase can be modulated over the pulse duration of a pulse by applying a different temporal delay to different points of the waveform. A different temporal delay can be applied to different points of the waveform by passing the optical pulse through a medium and varying an index of refraction of the medium as the pulse passes through the medium.

An amplitude of the modulation can vary randomly over the pulse duration of the pulse. An amplitude of the modulation can vary in a manner that reduces one or more of dynamic speckle and bandwidth of the light beam of pulses directed toward the substrate.

Each pulse can have a first spatial coherence defined by a first spatial coherence length, and the method can include reducing a spatial coherence of the pulse as it is being modulated such that the modified pulse has a second spatial coherence defined by a second spatial coherence length that is less than the first spatial coherence length of the pulse.

In other general aspects, an apparatus includes a light source, a phase modulator system, a measurement apparatus, and a control system. The light source is configured to produce a light beam made up of pulses having a wavelength in the deep ultraviolet range, each pulse having a first temporal coherence defined by a first temporal coherence length and each pulse being defined by a pulse duration. The phase modulator system is in the path of the light beam of pulses and is configured to, for at least one pulse, modulate the optical phase over the pulse duration of the pulse to produce a modified pulse having a second temporal coherence defined by a second temporal coherence length that is less than the first temporal coherence length. The measurement apparatus is configured to measure a characteristic of a test pulse. A test pulse is either a pulse having the first temporal coherence or the modified pulse having the second temporal coherence. The control system is in communication with the measurement apparatus and the phase modulator system. The control system is configured to: receive the measured characteristic of the test pulse from the measurement apparatus; determine whether a bandwidth of the modified pulse is within a range of a target bandwidth based on the received measured characteristic; and, if it is determined that the bandwidth of the modified pulse is outside the range of the target bandwidth, then adjusting a frequency at which the optical phase over the pulse duration of the pulse that produces the modified pulse is modulated.

Implementations can include one or more of the following features. For example, the apparatus can include a beam directing apparatus in the path of a light beam of pulses formed from the modified pulses. The beam directing apparatus can be configured to direct the light beam of pulses formed from the modified pulses toward a substrate within a lithography exposure apparatus. The phase modulator system can be within the lithography exposure apparatus. The phase modulator system can include a two-dimensional array of phase modulators. The two-dimensional array of phase modulators can be positioned within a beam homogenizer. The two-dimensional array of phase modulators can also be configured to, for each pulse, reduce a spatial coherence of the pulse so that the modified pulse has a second spatial coherence that is less than the spatial coherence of the pulse.

The light source can include: a first stage light source configured to produce a seed light beam made up of pulses and including a spectral tuning apparatus for tuning one or more spectral features of the seed light beam, and a second stage optical amplifier having a resonator with a gain medium, the optical amplifier configured to receive the pulses of the seed light beam and produce a light beam made up of amplified pulses. The first stage light source can be configured to produce the seed light beam made up of pulses includes a solid state gain medium. The phase modulator system can be between the first stage light source and the second stage optical amplifier.

The test pulse can be a modified pulse.

The control system can be in communication with the light source, and the control system can be configured to, if it is determined that the bandwidth of the modified pulse falls outside the target bandwidth range, send a signal to the light source to adjust the bandwidth of the pulses.

The characteristic of the test pulse that is measured by the measurement apparatus can be the bandwidth of the test pulse.

The apparatus can include an optical temporal pulse stretcher configured to increase a duration of the modified pulses. The optical temporal pulse stretcher can be a passive optical element.

The phase modulator system can include a Pockels cell including a medium through which the light beam of pulses passes. The optical phase can be modulated over the pulse duration of a pulse by modulating the index of refraction of the medium of the Pockels cell.

The phase modulator system can include a single phase modulator or a plurality of phase modulators.

DESCRIPTION OF DRAWINGS

FIG. 1 is a block diagram of a photolithography system producing a pulsed light beam that is directed to a photolithography exposure apparatus;

FIG. 2 is a graph of an exemplary optical spectrum of the pulsed light beam produced by the photolithography system of FIG. 1;

FIG. 8A is a graph of an exemplary phase modulation applied to a pulse of the pulsed light beam as a function of time;

FIG. 8B is a graph of the frequency content of the exemplary phase modulation of FIG. 8A;

FIG. 17A is a block diagram of an exemplary photolithography exposure apparatus;

FIG. 17B is a block diagram of an exemplary illumination module within the photolithography exposure apparatus of FIG. 17A;

FIG. 20 is a block diagram of an exemplary spectral feature selection system within the photolithography system of FIG. 1;

DESCRIPTION

Figure 3:
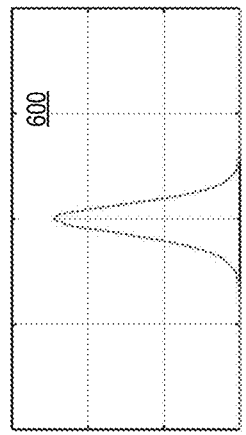
FIG. 3 is a graph of an exemplary optical spectrum of the pulsed light beam, in which the optical spectrum includes unwanted structures.

Referring to FIG. 1, a photolithography system 100 includes an optical source 105 (such as an excimer light source) that produces a light beam 110 of pulses, under control of a control system 185. The pulses of the light beam 110 have a wavelength that is nominally at a center wavelength in the deep ultraviolet (DUV) range, for example, between about 10 nanometers (nm) to about 400 nm. In some implementations, the wavelength of the pulses is about 248 nm while in other implementations, the wavelength of the pulses is about 193 nm. The optical source 105 emits light in the form of optical pulses, rather than a continuous wave. Thus, the optical source 105 emits pulses of energy that have a short time duration. These periodic pulses can be considered a pulse train and form the light beam 110. The duration of a pulse (also called the pulse width or length) can be defined as the time during which the power of the pulse remains continuously above a percentage (for example a half) of its maximum value.

The light beam 110 is directed to a photolithography exposure apparatus (or scanner) 115 by way of a beam preparation system 112 that can include beam directing and beam modification optics. Specifically, within the photolithography exposure apparatus 115, the pulsed light beam 110 is directed through an optical arrangement 113, which is configured to prepare and modify the light beam 110 as needed before directing the light beam 110 toward a semiconductor substrate (wafer) 120 on a wafer stage 121. The light beam 110 and the wafer 120 are scanned (moved) relative to each other under the control of a lithography controller 140 to thereby pattern microelectronic features on the wafer 120. The size of the microelectronic features patterned on the wafer 120 depends on the wavelength of the light beam 110, with a lower wavelength resulting in a smaller minimum size of the microelectronic feature. When the wavelength of the light beam 110 is 248 nm or 193 nm, the minimum size of the microelectronic features can be, for example, 50 nm or less. The focus location of the pulses of the light beam 110 at the wafer 120 correlates with the wavelength of the light beam 110. Moreover, the bandwidth of the light beam 110 can impact the critical dimension (CD) of these features.

Various disturbances (such as, for example, temperature gradients, pressure gradients, optical distortions) act on the optical source 105 and the light beam 110 to modify characteristics such as the spectral properties or features (such as the bandwidth and the wavelength) or the energy of the light beam 110. For example, chromatic aberration caused by optical components that interact with the light beam 110 can cause an increase in the bandwidth of the light beam 110. Thus, the photolithography system 100 includes other components, such as, for example, a spectral feature selection system 130 (which is configured to adjust one or more spectral features of the light beam 110) and a metrology system 170 (which is configured to measure one or more characteristics of the light beam 110). Along with the control system 185, these components are used in combination to determine the impact of the disturbances on the light beam 110 and to correct for the effect of such disturbances on the light beam 110.

Due to the design of the optical source 105, the pulses of the light beam 110 have coherence, both temporal coherence and spatial coherence, and this coherence (either or both temporal and spatial) can lead to a speckle pattern at the wafer 120. A speckle pattern is an intensity pattern produced by the mutual interference of a set of wavefronts of the light beam 110, and the interference is higher with higher levels of coherence, both temporal coherence and spatial coherence. Speckle patterns produced at the wafer 120 are unwanted because they can lead to a reduction in CD uniformity (CDU) and therefore lead to a blurring of the microelectronic features produced on the wafer 120.

Static speckle is caused by spatial coherence in the light beam 110 and dynamic speckle is caused by temporal coherence in the light beam 110. The photolithography system 100 includes a phase modulator system 145 which is placed in the path of a light beam of pulses. The phase modulator system 145 is configured to, for each pulse, produce a modified pulse that has a temporal coherence that is less than the temporal coherence of the pulse that enters the phase modulator system 145 to thereby reduce the dynamic speckle that arises at the wafer 120. The phase modulator system 145 can be placed in the path of the light beam 110 output from the optical source 105 or it can be placed in the path of a light beam such as a seed light beam produced within the optical source 105, as discussed below. The light beam 110 of pulses is formed from these modified pulses (which have a reduced temporal coherence); and this formed light beam 110 of pulses is directed toward the wafer 120 within the photolithography exposure apparatus 115.

Referring to FIG. 2, each pulse of the light beam 110 exhibits an optical spectrum 200. The optical spectrum 200 can be referred to as the spectral shape or spectrum of the light beam 110. The optical spectrum 200 contains information about how the optical energy or power of the light beam 110 is distributed over different wavelengths (or frequencies) 202. The optical spectrum 200 of the light beam 110 is depicted in the form of a diagram in which the spectral intensity 201 is plotted as a function of the wavelength or optical frequency 202. Spectral properties or features of the light beam 110 include any aspect or representation of this optical spectrum 200. For example, bandwidth is a spectral feature. The bandwidth of the light beam 110 is a measure of the width W of this optical spectrum 200, and this width W can be given in terms of wavelength or frequency of the laser light. Any suitable mathematical construction (for example, metric) related to the details of the optical spectrum 200 can be used to estimate a value that characterizes the bandwidth of the light beam. For example, the full width of the optical spectrum 200 at a fraction (X) of the maximum peak intensity of the spectral shape (referred to as FWXM) can be used to characterize the light beam bandwidth. As one example, in a commonly used spectral-shape characterization, the fraction X is 50% and the respective metric is referred to as the full width at half maximum (FWHM). As another example, the width of the optical spectrum 200 that contains a fraction (Y) of the integrated spectral intensity (referred to as EY) can be used to characterize the light beam bandwidth. In one example, in common use for characterizing the spectral properties of the light beam 110, the fraction Y is 95%.

The pulses of the light beam 110 have temporal coherence because longitudinal cavity modes are produced by the geometry and configuration of the resonator or resonators within the optical source 105, and these longitudinal cavity modes interfere with each other and produce unwanted structures in the optical spectrum of each pulse. An exemplary optical spectrum 300 having unwanted structures is depicted schematically in FIG. 3. Moreover, each pulse of the light beam 110 can produce different unwanted structures. The bandwidth of a pulse of the light beam 110 can be measured (with, for example, the metrology system 170) by averaging over the number of pulses that the photolithography exposure apparatus 115 uses to illuminate a single position on the wafer 120. The averaged value of the bandwidth is an effective bandwidth and it can be a smooth function of the wavelength.

Figure 4:
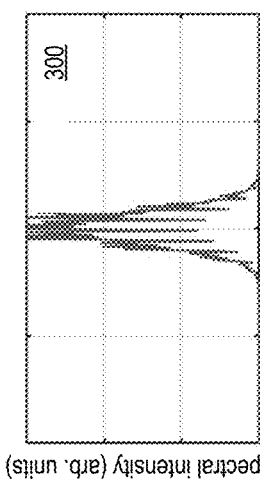
FIG. 4 is a graph of an exemplary interference visibility for the optical spectrum of FIG. 3.

The amount of temporal coherence of a pulse is a measure of the average correlation between the value of the electric field waveform of the pulse and itself delayed by an amount τ, at any pair of times. The delay over which the phase of the electric field waveform wanders by a significant amount (and hence the correlation decreases by a significant amount) is defined as the coherence time $T_C$. At a delay τ of 0, the degree of coherence is perfect but the degree of coherence drops significantly as the delay τ approaches $T_C$. The temporal coherence can be measured in an interferometer such as a Michelson interferometer, in which the electric field waveform of the pulse is combined with a copy of itself that is delayed by a time τ. A detector measures the time-averaged intensity of the light exiting the interferometer, and the resulting interference visibility gives the temporal coherence at the delay τ. An exemplary interference visibility 400 is shown in FIG. 4 for the optical spectrum 300 of FIG. 3. The interference visibility is calculated as the Fourier transform of the normalized power spectral density of the pulse, and the coherence time $T_C$ (from which the coherence length can be calculated) is calculated as $$T_C = \int |\text{visibility}|^2 d\tau.$$

The coherence length $L_C$ can be calculated from the coherence time $T_C$; specifically, the coherence length $L_C$ is the distance that the pulse wave travels in the coherence time $T_C$. In the example of FIGS. 3 and 4, the coherence length $L_C$ is unacceptably high. The structures in the optical spectrum 300 (FIG. 3) of each pulse of the light beam 110 causes the side bands in the visibility (FIG. 4), and therefore leads to a larger temporal coherence length $L_C$ than one would expect based on slit-average bandwidth. By passing the pulse through the pulse modulator system 145, the coherence length $L_C$ of the pulse is reduced to an acceptable level, as discussed with reference to FIGS. 5-7.

Figure 5:
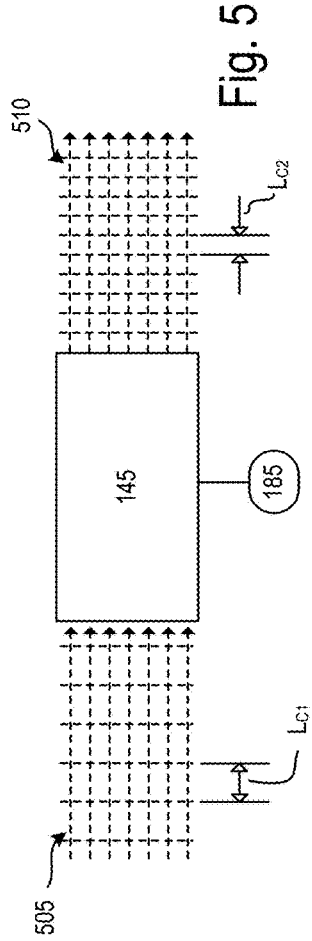
FIG. 5 is a block diagram of an exemplary phase modulator system of FIG. 1.

Referring to FIG. 5, in particular, a pulse 505 that enters the phase modulator system 145 has a first temporal coherence that is defined by a first temporal coherence length $L_{C1}$. For example, the pulse 505 that enters the phase modulator system 145 could be the pulse that exhibits the unwanted structures in the optical spectrum 300 (and also has a greater-than-desired temporal coherence length $L_C$ such as shown in FIG. 4). The phase modulator system 145 reduces the temporal coherence of the pulse 505 by modulating the optical phase over the pulse duration of the pulse 505 to produce a modified pulse 510 having a second temporal coherence defined by a second temporal coherence length $L_{C2}$ that is less than the first temporal coherence length $L_{C1}$. The electric field of the modified pulse 510 can be described as a multiplication of electric field of the incoming pulse 505 times the phase rotation or delay introduced by the phase modulator system 145. The optical spectrum of the electric field of the modified pulse 510 is convoluted or averaged by the Fourier transform of the phase modulation provided by the phase modulator system 145.

The second temporal coherence length $L_{C2}$ can be a fraction or percentage of the first temporal coherence length $L_{C1}$. For example, the second temporal coherence length $L_{C2}$ can be between 50-95% of the first temporal coherence length $L_{C1}$. Such a reduction in temporal coherence length can lead to an overall reduction in speckle at the wafer 120 of between 5-30%, for example, about 18%. As discussed below in greater detail, the amount by which the temporal coherence is reduced is limited by other characteristics (such as the bandwidth) of the pulse) that are impacted by performing a phase modulation on the pulse.

Figure 6:
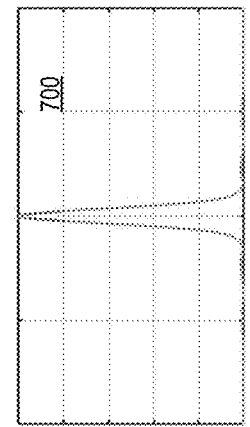
FIG. 6 is a graph of an exemplary optical spectrum of a modified pulsed light beam output from the phase modulator system of FIG. 5.
Figure 7:
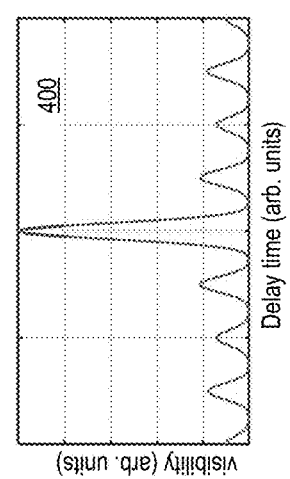
FIG. 7 is a graph of an exemplary interference visibility for the optical spectrum of FIG. 6.

An exemplary modified optical spectrum 600 of the modified pulse 510 is shown in FIG. 6, and the interference visibility 700 of the modified optical spectrum 600 is shown in FIG. 7. The structures present in the optical spectrum 300 have mostly been removed or greatly reduced in the modified optical spectrum 600. Moreover, the temporal coherence length $L_C$ of the modified optical spectrum 600 (and the modified pulse 510) is reduced relative to the coherence length $L_C$ of the incoming pulse 505. Specifically, the temporal coherence length $L_C$ of the modified optical spectrum 600 is calculated based on the temporal coherence time $T_C$, which is calculated from the interference visibility 700 shown in FIG. 7.

In general, the temporal coherence length of a pulse is inversely proportional to the instantaneous bandwidth of the pulse. Thus, in general, if the temporal coherence length is reduced (by performing the phase modulation discussed herein), then the instantaneous bandwidth of the pulse 510 at the output of the phase modulator system 145 increases relative to the instantaneous bandwidth of the pulse 505 at the input of the phase modulator system 145. However, as discussed herein, the overall slit-averaged bandwidth (the bandwidth seen by the wafer 120) remains constant or within a range of acceptable bandwidths for two reasons. First, the bandwidth of the incoming pulses 505 is reduced to offset some of the shift to the instantaneous bandwidth of the outgoing pulses 510. Second, the wafer 120 experiences the slit-averaged bandwidth, which is not affected by the shifts in the instantaneous bandwidth on a pulse to pulse basis because the values of shifts are averaged out over the slit.

Referring to FIG. 8A, an exemplary phase modulation 800 is shown. In FIG. 8A, the phase modulation shows an amplitude of the phase that is applied to the pulse 505 as a function of time. The frequency of the phase modulation is the rate at which the optical phase of the pulse is modified or delayed. Thus, the frequency f can be considered as $1/\Delta t$, where $\Delta t$ is the time between the peaks of the phase modulation. In practice, a range of frequencies is applied to the phase modulator system 145. FIG. 8B shows the frequency content of the phase modulation 800 applied to the pulse 505. Specifically, FIG. 8B can be considered as the Fourier transform of the phase modulation 800. In this example, as shown, many frequencies are applied and the limiting value of the frequency is 1 in arbitrary units (for example, 1 GHz). The limiting value of the frequency (which is the maximum allowed frequency permitted) can be changed by filtering so as to change the frequency content of the phase modulation 800. As the maximum allowed frequency of the phase modulation is increased and thus, a greater range of frequencies is applied, the bandwidth of the modified pulse 510 increases. Thus, the maximum allowed frequency of the phase modulation is selected (for example, by signal filtering) so as to not increase the bandwidth of the modified pulse 510 beyond a target bandwidth.

Figure 9:
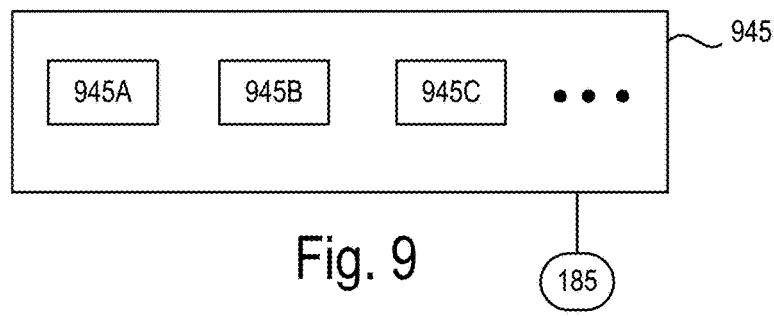
FIG. 9 is a block diagram of an exemplary phase modulator system that includes one or more phase modulators.
Figure 10:
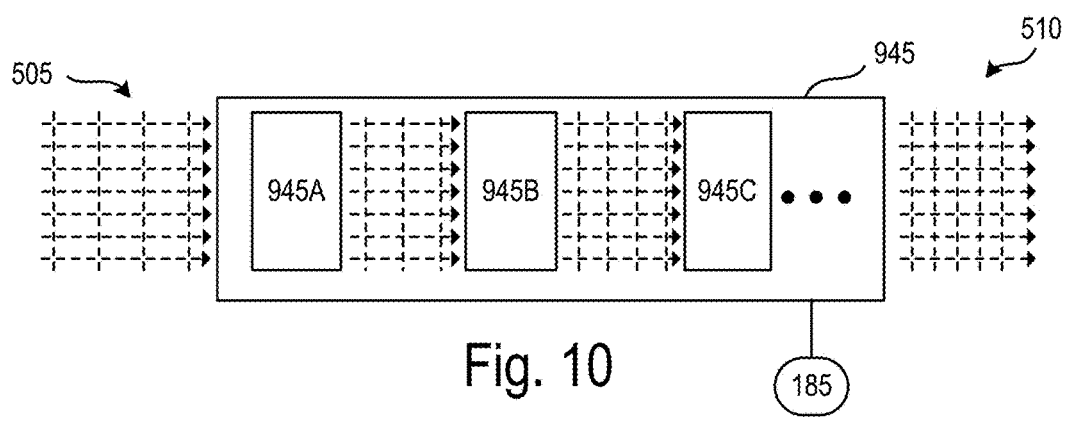
FIG. 10 is a block diagram of an exemplary phase modulator system in which the one or more phase modulators are optically arranged in series.

Referring to FIG. 9, an exemplary phase modulator system 945 includes one or more phase modulators 945A, 945B, 945C, etc. In an implementation in which the phase modulator system 945 includes a plurality of phase modulators 945A, 945B, 945C, etc., then the phase modulators 945A, 945B, 945C, etc. can be optically arranged in series so that each pulse passes in series (or sequentially) through each of the phase modulators 945A, 945B, 945C, etc. Such an arrangement is shown in FIG. 10. In this arrangement, it is possible to have other optical elements arranged between two or more of the phase modulators 945A, 945B, 945C, etc.

Figure 11:
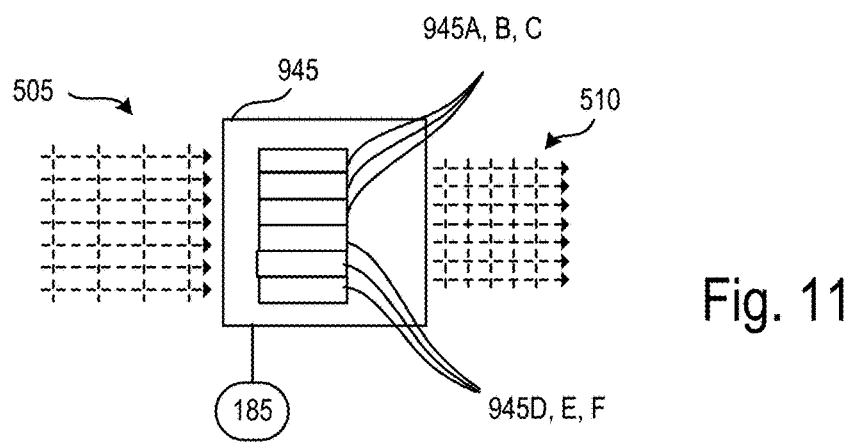
FIG. 11 is a block diagram of an exemplary phase modulator system in which the one or more phase modulators are optically arranged in parallel.

On the other hand, in the implementation in which the phase modulator system 945 includes a plurality of phase modulators 945A, 945B, 945C, etc., then the phase modulators 945A, 945B, 945C, etc. can be optically arranged in parallel so that a portion of each pulse passes through one of the phase modulators 945A, 945B, 945C, etc. and each portion passes through a phase modulator 945A, 945B, 945C, etc. simultaneously. Such an arrangement is shown in FIG. 11, which shows six phase modulators 945A, 945B, 945C, 945D, 945E, 945F arranged in parallel. Such an arrangement could be a two dimensional array of phase modulators, in which the array extends along a direction that is transverse to the direction of the pulse 505.

Figure 12:
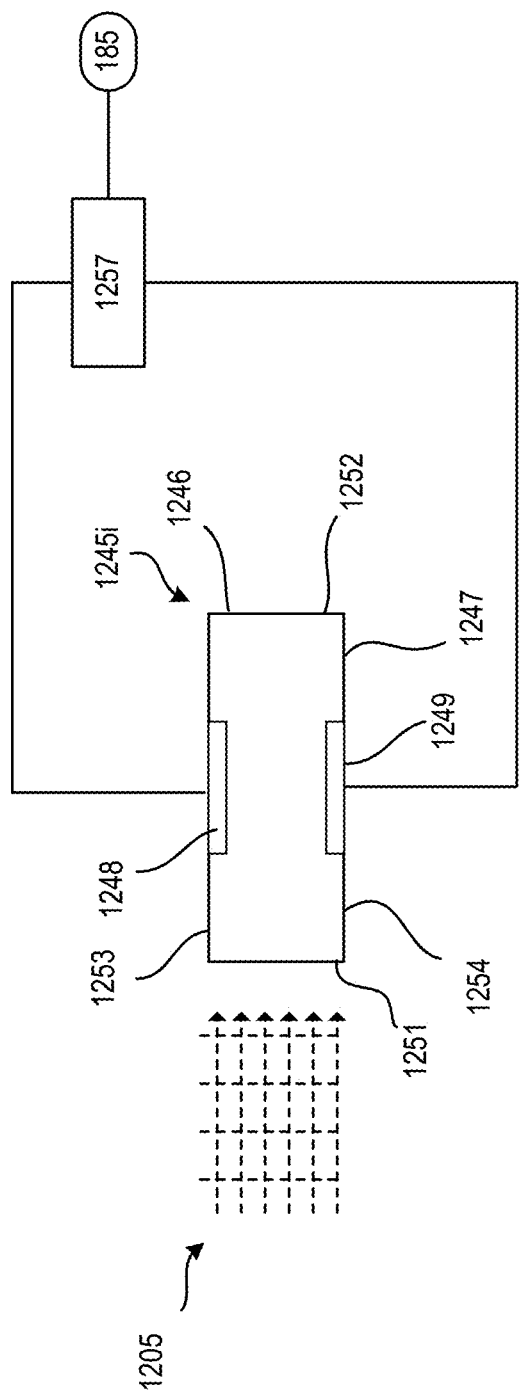
FIG. 12 is a block diagram of an exemplary phase modulator of the phase modulator system, in which the exemplary phase modulator is designed as a Pockels cell.

Referring to FIG. 12, an exemplary phase modulator 1245i can be designed as a Pockels cell 1246. The Pockels cell 1246 includes an electro-optic crystal 1247 through which a pulse 1205 (such as the pulse 505) propagates. The phase delay in the crystal 1247 can be modulated by applying a variable electric voltage to electrodes 1248, 1249 that are connected to the crystal 1247. The electrodes 1248, 1249 are connected to a voltage source 1257, which is controlled by the control system 185. Exemplary voltages applied to the crystal 1247 range from a kilovolt to several or tens of kilovolts. The refractive index of the electro-optic crystal 1247 changes in proportion to the electric field that is applied by the electrodes 1248, 1249, and the refractive index changes with the refractive index. Thus, by changing or modulating the refractive index in the crystal 1247, the phase delay is modulated.

The geometric arrangement of the electrodes 1248, 1249 within the Pockels cell 1246 governs how the electric field is arranged relative to the direction at which the pulse 505 travels. For example, the Pockels cell 1246 can be a longitudinal device in which the electrodes 1248, 1249 are arranged at the input face 1251 and output face 1252 of the crystal 1247 and in this case, the electric field that is produced is along the longitudinal direction, which is parallel with the direction of the pulse 505. As another example, the Pockels cell 1246 can be a transverse device in which the electrodes 1248, 1249 are arranged at one or more sides 1253, 1254 of the crystal 1247, and in this case, the electric field that is produced is along the transverse direction, which is perpendicular to the direction of the pulse 505.

The crystal 1247 is made of a material that changes it refractive index by controlling the electric field through the crystal 1247 using the electrodes 1248, 1249. The material of the crystal 1247 should be transmissive at the wavelength of the pulse 1205, and thus, it should be transmissive to DUV light. Moreover, the material of the crystal 1247 should be made of a material that has a high threshold for optical damage because the pulses 1205 that pass through the crystal 1247 have high optical powers. For example, with reference to FIG. 19, the pulses in a seed light beam 1910A output by a master oscillator (MO) 1900 can be about 1-6 Watts (W) (for example, at a pulse repetition rate of 6000 Hz, each pulse has an instantaneous energy of 1 millijoules (mJ)) while the pulses in the light beam 110 at the output of the power amplifier 1925 can be about 10-200 W. For example, the crystal 1247 can be made of potassium dihydrogen phosphate (KDP), deuterated KDP (DKDP), ammonium dihydrogen phosphate (ADP), beta-barium borate (BBO), or quartz.

Figure 13A:
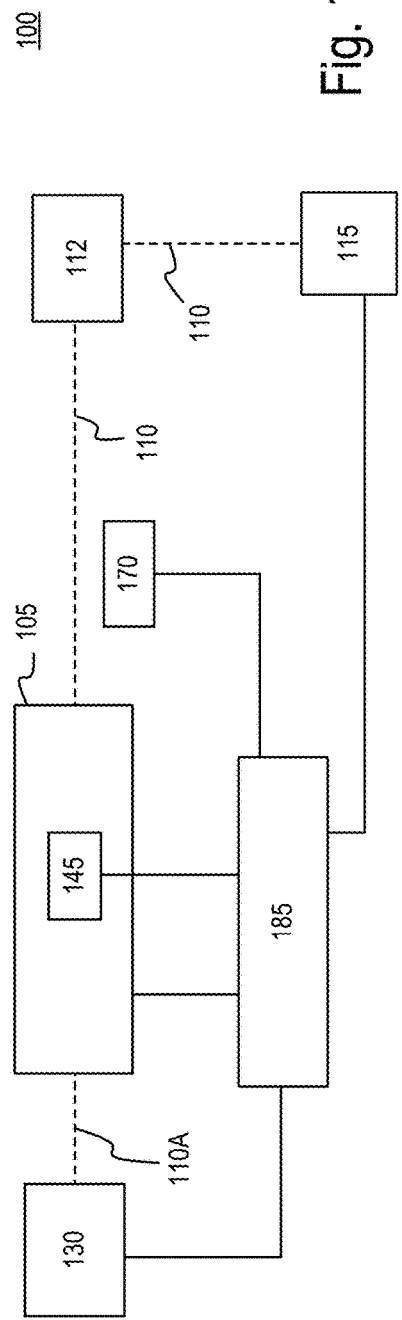
FIG. 13A is a block diagram of an exemplary photolithography system in which the phase modulator system is placed within an optical source.
Figure 13B:
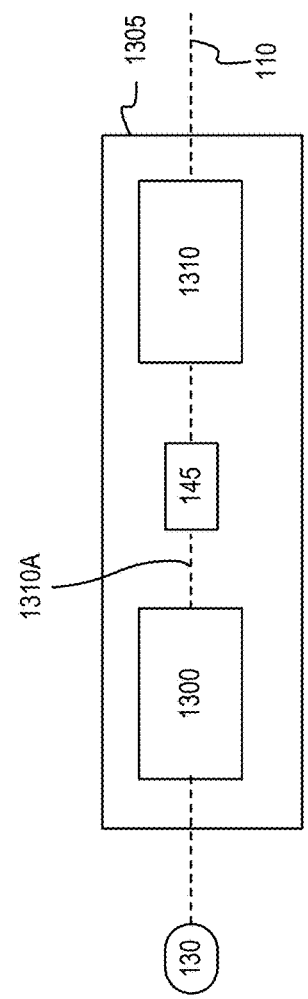
FIG. 13B is a block diagram of an exemplary optical source into which the phase modulator system is placed.

Referring to FIGS. 13A and 13B, in some implementations, the phase modulator system 145 is placed inside the optical source 105. Specifically, the optical source 105 can be designed as a dual stage optical source 1305, and in this case it can be beneficial to place the phase modulator system 145 between a first stage light source 1300 and a second stage optical amplifier 1310 and in the path of a seed light beam 1310A of pulses produced by the first stage light source 1300. Such a dual stage design separates the power generator (the second stage optical amplifier 1310) from the bandwidth and wavelength control generator (the first stage light source 1300). The power of the seed light beam 1310A is much lower than the power of the light beam 110 output from the second stage optical amplifier 1310. Thus, by placing the phase modulator system 145 in the path of the seed light beam 1310A, the fluence and power levels of the pulses entering the modulator system 145 are smaller (relative to those of the output light beam 110) and reduce the chance of damage to the materials within the phase modulator system 145.

Figure 14:
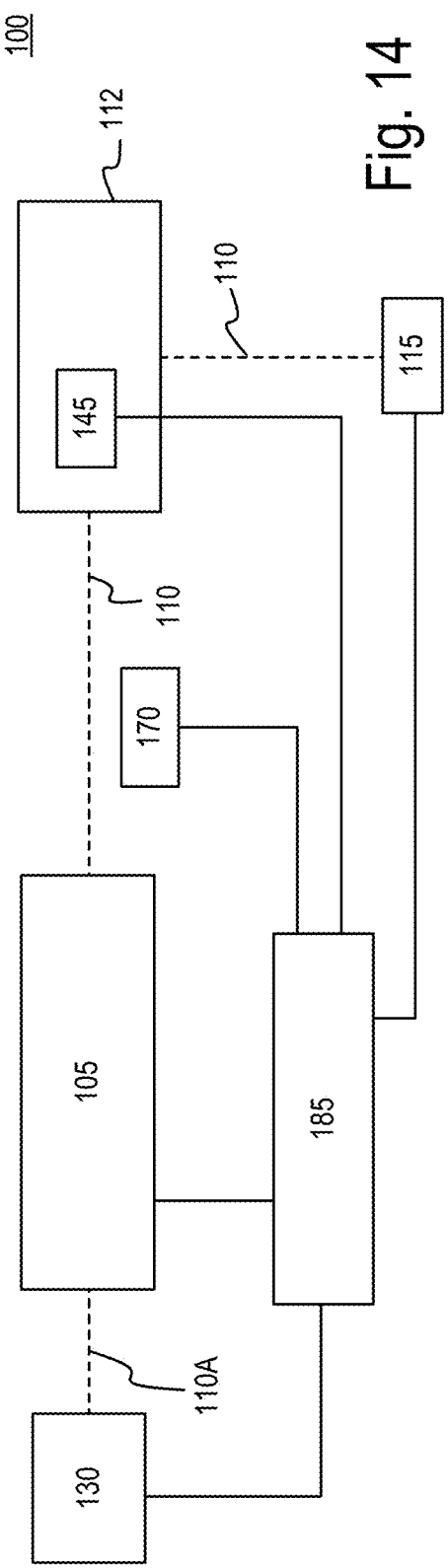
FIG. 14 is a block diagram of an exemplary photolithography system in which the phase modulator system is placed within a beam preparation system between the optical source and the photolithography exposure apparatus.

Referring to FIG. 14, in other implementations, the phase modulator system 145 is placed inside the beam preparation system 112 and in the path of the light beam 110 of pulses as they travel through the beam preparation system 112.

Figure 15A:
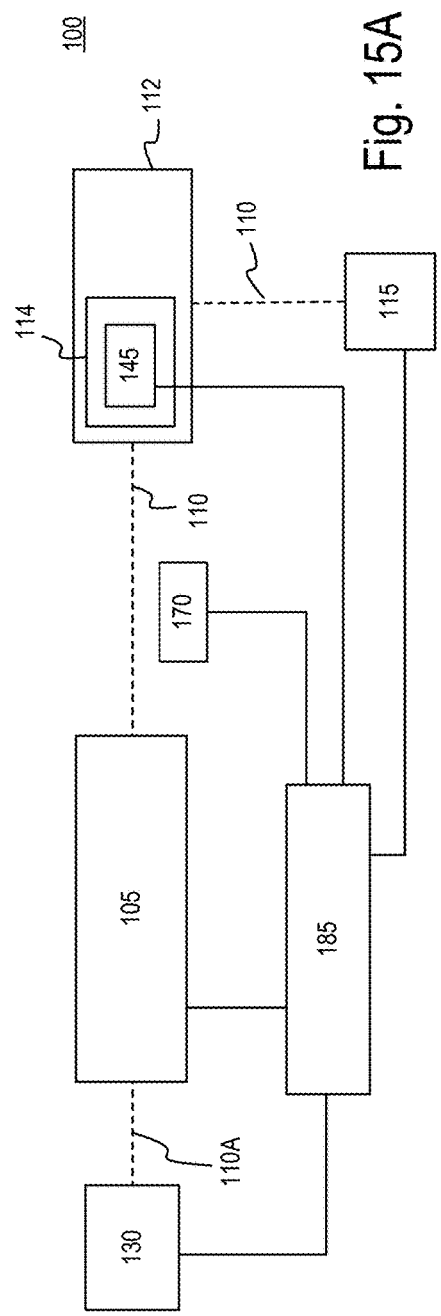
FIG. 15A is a block diagram of an exemplary photolithography system in which the phase modulator system is placed within an optical temporal pulse stretcher of the beam preparation system between the optical source and the photolithography exposure apparatus.
Figure 15B:
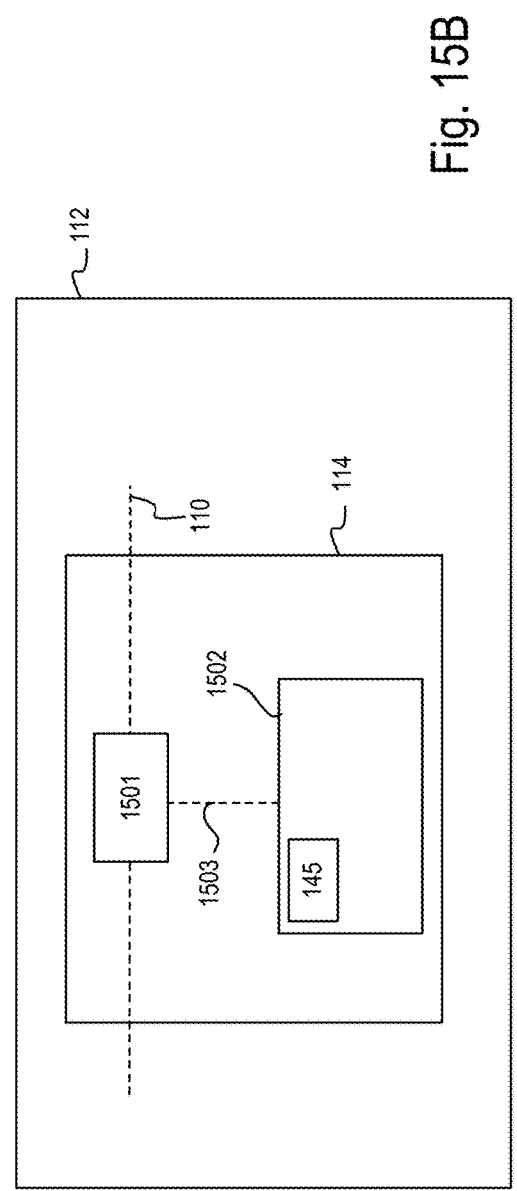
FIG. 15B is a block diagram of an exemplary optical temporal pulse stretcher into which the phase modulator system is placed.

For example, with reference to FIGS. 15A and 15B, the phase modulator system 145 is placed inside an optical temporal pulse stretcher 114 within the beam preparation system 112. The temporal pulse stretcher 114 is configured to increase a duration of the pulses that pass through it. The temporal pulse stretcher 114 optically acts on the pulse of the light beam 110 to increase a duration of the pulse without introducing significant losses so that the peak power of the light beam 110 is reduced without reducing its average power. The temporal pulse stretcher 114 is an optical and passive configuration of optical elements that split the amplitude of the pulse of the light beam 110 into split portions 1503 with one or more beam separators 1501, introduce optical delays 1502 among these split portions, and then recombine (for example, using the beam separator 1501) these temporally-delayed portions of the pulse to provide a temporally stretched pulse of the light beam 110 at the output. The temporal pulse stretcher 114 can therefore include optical components such as beam splitters (for the beam separator 1501) and reflective optics (that form the optical delay 1502). The reflective optics can be flat mirrors or curved (for example, concave or convex) mirrors that could be confocal. The delay introduced in the split portion of the pulse produced by the temporal pulse stretcher 114 is equal to or longer than the fast temporal component of the light beam 110. The phase modulator system 145 can be placed into the split portion of the pulse of the light beam 110. By applying the optical phase modulation to the pulse of the light beam 110 within the split portion, the fluence levels on the phase modulator system 145 can be lower (by, for example, 50% of the fluence level of the light beam 110 that is not split off). Moreover, by placing the phase modulator system 145 in the split portion of the pulse of the light beam 110, recombined portions of the pulse within the temporal pulse stretcher 114 can be made independent of one another and thereby reduce the temporal coherence of the pulses. Specifically, the phase modulator system 145 acts on the split and delayed portions of the pulse and ensures that these split portions are incoherent with the un-delayed portions before recombining.

Figure 16A:
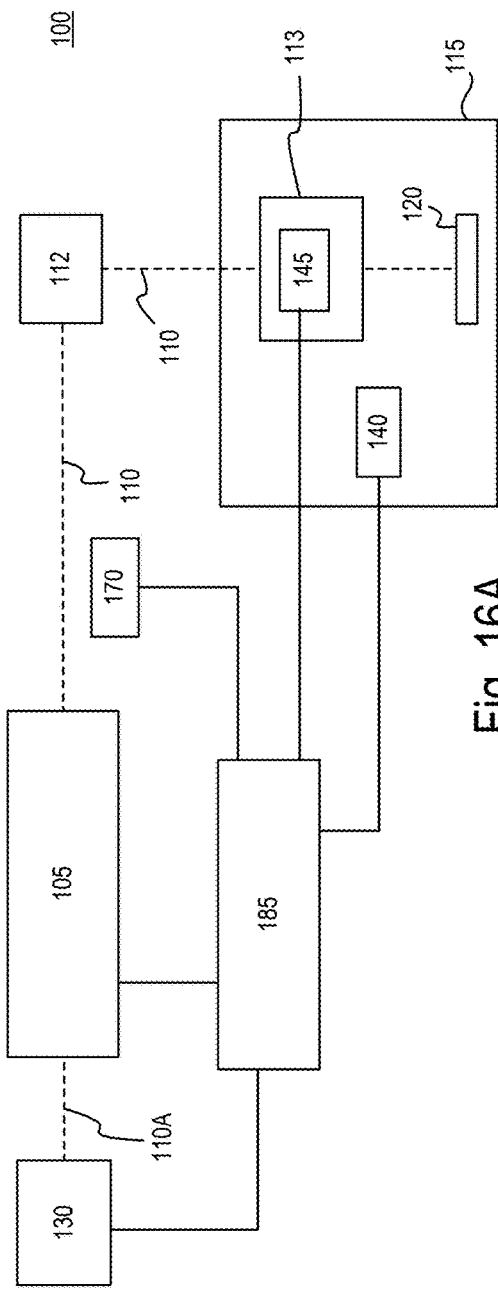
FIG. 16A is a block diagram of an exemplary photolithography system in which the phase modulator system is placed within an optical arrangement of the photolithography exposure apparatus.
Figure 16B:
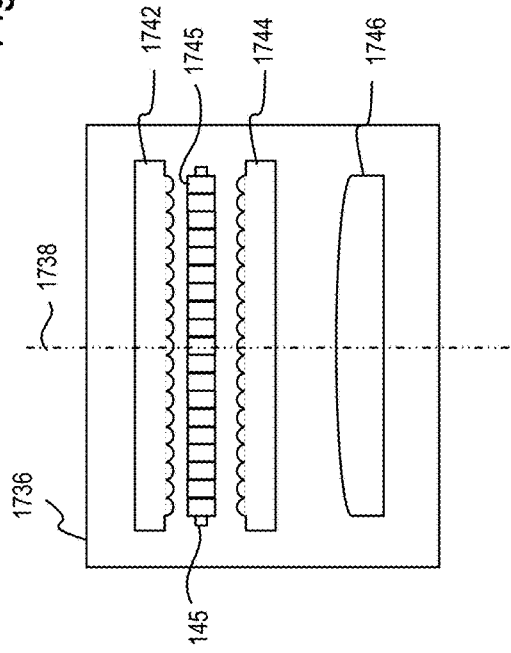
FIG. 16B is a block diagram of an exemplary optical arrangement within which the phase modulator system is placed.

Referring to FIGS. 16A and 16B, in other implementations, the phase modulator system 145 is placed inside the optical arrangement 113 within the photolithography exposure apparatus 115. Details about the photolithography exposure apparatus 115 are provided next, before discussing the placement and configuration of the phase modulator system 145 within the optical arrangement 113.

Referring to FIG. 17A, the optical arrangement 113 includes, among other features, the illumination module 1702, a reticle stage including a reticle or mask 1734, a projection stage 1704 including, among other optics, one or more projection lenses 1730. The mask 1734 is movable along one or more directions, such as along an optical axis 1738 of the pulsed light beam 110 or in a plane that is perpendicular to the optical axis 1738. The projection stage 1704 includes a projection lens 1730 and enables the image transfer to occur from the mask 1734 to the photoresist on the wafer 120.

The illumination module 1702 creates the pupil shape, that is, the condition and shape of the light beam 110 before it interacts with the mask 1734. For example, the illumination module 1702 adjusts the range of angles for the light beam 110 impinging on the mask. The illumination module 1702 includes a device 1732 that conditions the light beam 110 and causes the light beam 110 to take on the prescribed shape before it interacts with the mask 1734. For example, the device 1732 can include an array of individually adjustable micro-mirrors that can create the pupil shape in rapid fashion (for example, in seconds or minutes). The array can include hundreds or thousands of micro-mirrors and can be programmable. Moreover, the device 1732 can include a field defining element (FDE). The micro-mirrors of the array can be used to illuminate certain positions of the entrance plane of the FDE. The FDE converts each individual position in its entrance plane to an angle on the reticle level while simultaneously creating a uniform illumination spot. Thus, by changing the micro-mirrors, any angle distribution (or pupil) at the reticle level can be made to have a uniform intensity distribution.

The illumination module 1702 also includes a beam homogenizer 1736 that homogenizes (makes uniform) the intensity distribution of the pulsed light beam 110 across the mask 1734. Referring to FIG. 17B, the beam homogenizer 1736 can include a pair of two dimensional lenslet arrays 1742, 1744 and a condenser lens 1746 to provide a uniform irradiance at an illumination plane 1748 (which can be at or within the device 1732). The first lenslet array 1742 with which the light beam 110 interacts can be considered an objective array and the second lenslet array 1744 with which the light beam 110 interacts can be considered a field array. The objective array images the source at the field array, and the field array reimages all of the fields with the condenser lens so that they overlap at the illumination plane and create a uniform irradiance. The two dimensional lenslet arrays 1742, 1744 include a plurality of lenslets (small lenses) arranged in a plane that extends perpendicularly to the optical axis 1738.

The lithography apparatus 115 can include, among other features, a lithography controller 140, air conditioning devices, and power supplies for the various electrical components. The lithography controller 140 controls how layers are printed on the wafer 120.

The wafer 120 is irradiated by the light beam 110. A process program or recipe determines the length of the exposure on the wafer 120, the mask 1734 used, as well as other factors that affect the exposure. During lithography, a plurality of pulses of the light beam 110 illuminates the same area of the wafer 120 to form an illumination dose. The number of pulses N of the light beam 110 that illuminate the same area can be referred to as an exposure window or slit and the size of this slit can be controlled by an exposure slit (not shown) placed before the mask 1734. The slit can be designed like a shutter and can include a plurality of blades that can be opened and closed; and the size of the exposed area is determined by the distance between the blades in the non-scanning direction and also by the length (the distance) of the scan in the scanning direction. In some implementations, the value of N is in the tens, for example, from 10-100 pulses. In other implementations, the value of N is greater than 100 pulses, for example, from 100-500 pulses. One or more of the mask 1734, the projection stage 1704, and the wafer 120 can be moved relative to each other during the exposure to scan the exposure window across an exposure field. The exposure field is the area of the wafer 120 that is exposed in one scan of the exposure slit or window.

As mentioned above, the phase modulator system 145 can be placed inside the optical arrangement 113 within the photolithography exposure apparatus 115. The phase modulator system 145 can be placed in the illumination module 1702. For example, as shown in FIG. 16B, the phase modulator system 145 is placed inside the beam homogenizer 1736.

In some implementations, the phase modulator system 145 is placed near one of the two dimensional lenslet arrays 1742, 1744 or between the two dimensional lenslet arrays 1742, 1744. In this example, the phase modulator system 145 can be a two dimensional array of phase modulators 1745 (only one of which is labeled in FIG. 16B for clarity)

optically arranged in parallel with each other. Such a design is similar to that shown in FIG. 11. The phase modulators 1745 are arranged in a plane that extends along the direction perpendicular to the optical axis 1738 while the pulses of the light beam 110 travel through the phase modulators 1745 along the direction of the optical axis 1738. Moreover, the number of phase modulators in the array of the phase modulator system 145 can correspond to the number of lenslets in the arrays 1742, 1744 and each phase modulator 1745 aligns with a pair of lenslets from respective arrays 1742, 1744. By placing the phase modulator system 145 within the beam homogenizer 1736, speckle can be reduced even more because correlation present between the lenslets of the arrays 1742, 1744 can be reduced or removed.

In other implementations, the phase modulator system 145 can be placed between the lenslet array 1744 and the condenser lens 1746 or before the lenslet array 1742. In other implementations, the phase modulator system 145 is placed in the device 1732 or close to the array of individually adjustable micro-mirrors. The phase modulator system 145 can be placed on top of or in close proximity of a focusing array of lenses (not shown) that focus the light from the beam homogenizer 1736 on each individual micro-mirrors of the device 1732 to ensure that no light spills over the micro-mirrors. For example, the phase modulator system 145 can be placed between the beam homogenizer 1736 and the focusing array of lenses in the device 1732.

Because of the disturbances, the actual spectral feature (such as the bandwidth or the wavelength) of the pulses of the light beam 110 at the wafer 120 may not correspond to or match with the desired spectral feature. Thus, the metrology system 170 measures or senses the actual spectral feature (such as a bandwidth or the wavelength) of light beam 110 during operation of the optical source 105 by estimating a value of a metric from a measured optical spectrum 200 (shown in FIG. 2). An operator or an automated system (for example, the control system 185) can use the measured or sensed bandwidth of the light beam 110 to adjust the properties of the optical source 105 (for example, by sending a signal to the spectral feature selection system 130) and to thereby adjust the optical spectrum (and the spectral features) of the light beam 110. The control system 185 receives the output of the metrology system 170 and analyzes the sensed spectral profile and estimates one or more spectral features of the light beam 110 based on this analysis.

Figure 18:
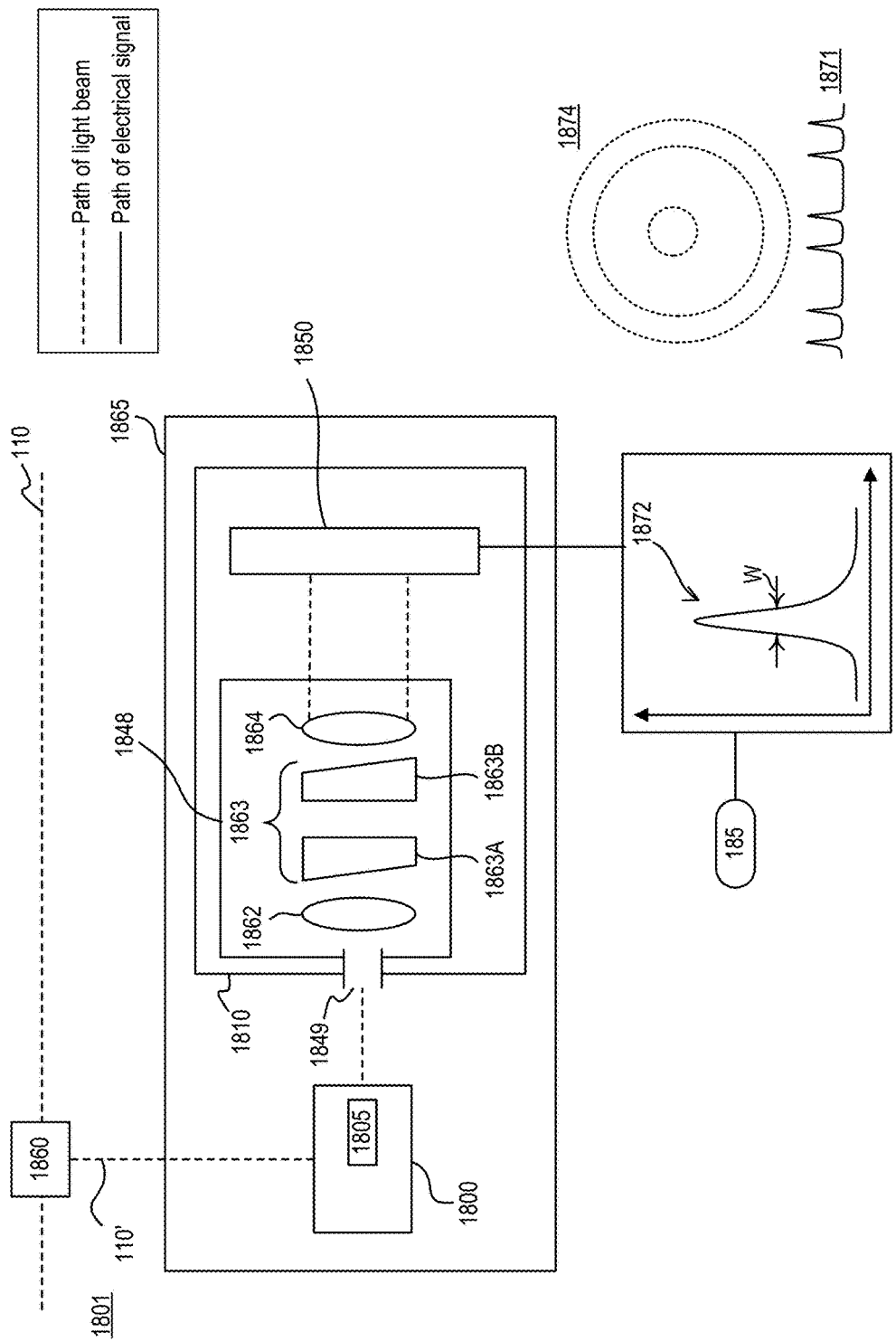
FIG. 18 is a block diagram of an exemplary spectral feature measurement system within the photolithography system of FIG. 1.

Referring to FIG. 18, the metrology system 170 includes a spectral feature measurement system 1801 having a beam separator 1860 and a diagnostic apparatus 1865. The diagnostic apparatus 1865 receives a pulsed light beam 110' that is separated from the light beam 110 by the beam separator 1860. The beam separator 1860 is placed in a path between the optical source 105 and the photolithography exposure apparatus 115. The beam separator 1860 directs the pulsed light beam 110' (which is a first portion or percentage of the pulsed light beam 110) into the diagnostic apparatus 1865 and directs a second portion or percentage of the pulsed light beam 110 toward the photolithography exposure apparatus 115. In some implementations, the majority of the pulsed light beam 110 is directed in the second portion toward the photolithography exposure apparatus 115. For example, the beam separator 1860 directs a fraction (for example, 1-2%) of the pulsed light beam 110 into the diagnostic apparatus 1865 and thus the pulsed light beam 110' has about 1-2% of the power of the pulsed light beam 110. The beam separator 1860 can be, for example, a beam splitter.

The diagnostic apparatus 1865 includes a spectral detection system 1810 that measures the spectral feature or features (such as the bandwidth and/or the wavelength) of the pulsed light beam 110 based on information about the optical spectrum 200 of the pulsed light beam 110'. As discussed herein, the spectral detection system 1810 include a spectrometer 1848 (such as an etalon spectrometer) that interacts with the pulsed light beam 110' and outputs spatial components that correspond to the spectral components of the light beam 110', and a sensor 1850 that estimates the spectral feature or features based on the outputted spatial components.

In order to uniformly sample the spectral content of the light beam 110' at the sensor 1850, to evenly distribute the intensity of the light beam 110' at the sensor 1850, and to provide a more accurate measurement of the spectral feature from the sensor 1850, the diagnostic apparatus 1865 includes a beam preparation system 1800 that includes, among other features, a beam homogenizer 1805. The beam homogenizer 1805 reduces speckle noise and improves beam homogenization of the pulsed light beam 110' impinging upon the sensor 1850 of the spectral detection system 1010.

The beam preparation system 1800 can include other elements or components for modifying aspects of the pulsed light beam 110'. For example, the beam preparation system 1800 can also include one or more pulse stretcher systems, one or more diffuser systems, and one or more spatial adjustment systems. The pulse stretcher system is a pulse stretcher that optically acts on the pulsed light beam 110' to increase a duration of the pulses in the pulsed light beam 110'' without introducing significant losses so that the peak power of the light beam 110' is reduced without reducing its average power. The diffuser system includes one or more optical elements that are configured to evenly diffuse the pulsed light beam 110'. The diffuser system causes the light beam 110' to spread evenly across a plane transverse to the direction along which the light beam 110' travels, thus minimizing or removing high intensity bright spots. The diffuser system can alter the angular divergence of the pulsed light beam 110'. The diffuser system smooths out or otherwise mitigates diffraction spikes that can sometimes be produced within the beam homogenizer. The diffuser system can be a microlens array or a diffractive optic (which can be transmissive or reflective). The spatial adjustment system works to refract the pulsed light beam 110' to spread out the spacing between diffraction spikes that can be created within the beam homogenizer. The spatial adjustment system can be a lens that is positioned so that its focal plane overlaps a beam homogenization plane produced by the beam homogenizer.

The spectral detection system 1810 includes an aperture 1849 through which the pulsed light beam 110' is directed, as well as an input lens 1862, an optical frequency separation apparatus (such as an etalon) 1863, and an output lens 1864. The aperture 1849 can be placed at a focal plane of the input lens 1862 so that each point from the focal plane acts as a point source and accordingly, the input lens 1862 acts to collimate the pulsed light beam 110' before entering the etalon 1863. The output lens 1864 is positioned at the exit of the etalon 1863 so that the focal plane of the output lens 1864 overlaps the active area of the sensor 1850.

In some implementations, the etalon 1863 includes a pair of partially reflective glass or optical flats 1863A, 1863B, which can be spaced a short distance (for example, millimeters to centimeters) apart, with the reflective surfaces facing each other. In other implementations, the etalon 1863 includes a single plate with two parallel reflecting surfaces. The flats 1863A, 1863B can be made in a wedge shape to prevent the rear surfaces from producing interference fringes; the rear surfaces often also have an anti-reflective coating. As the pulsed light beam 110' passes through the paired flats 1863A, 1863B, it is multiply reflected, and produces a plurality of transmitted rays, which are collected by the output lens 1864 and brought to the active region of the sensor 1850. The spectral detection system 1810 also can include an optical relay, as needed, between the output lens 1864 and the sensor 1850 to ensure that the sensor 1850 is at the focal plane of the output lens 1864.

The etalon 1863 interacts with the light beam 110' and outputs a plurality of spatial components 1874 (which is shown in schematic form in FIG. 18) that correspond to the spectral components of the pulsed light beam 110'. The spectral components of the light beam 110' are in the optical spectrum 1872 of the pulsed light beam 110'; therefore, they correspond to how the values of the optical energy or power (the spectral intensity) of the pulsed light beam 110' are distributed over the different wavelengths. The spatial components 1874 correspond to these intensities mapped into a two-dimensional space. Thus, the etalon 1863 transforms the spectral information (such as the wavelength) of the pulsed light beam 110' into spatial information that can be sensed or detected by the sensor 1850. The transformation maps the spectral information (such as the wavelength) to different positions in space so that the spectral information that can be observed by the sensor 1850.

The etalon 1863 produces as the spatial components 1874 an interference pattern that takes the appearance of a set of concentric rings. The interference pattern takes the appearance of a more uniform intensity distribution if the intensity distribution of the pulsed light beam 110' on the aperture 1849 is more uniform. In particular, the sharpness of the rings depends on the reflectivity of the flats 1863A, 1863B of the etalon 1863. Thus, if the reflectivity of the flats 1863A, 1863B is high (such that the etalon has a high quality (Q) factor), when the pulsed beam 110' is a monochromatic light beam, the etalon 1863 produces a set of narrow bright rings against a dark background. The transmission of the etalon 1863 as a function of wavelength is shown in the resulting fringe pattern 1871, which produces the optical spectrum 1872 that is directed to the control system 185. The complete interference pattern is not needed to perform the calculations or estimates; it is alternatively possible to generate only fringes within a region that is slightly larger than an active area of the sensor 1850. The sensor 1850 receives and senses the output spatial components 1874. The sensor 1850 can be defined by a plane that indicates generally the active area of its sensing region. The plane of the sensing region can be perpendicular to the direction of propagation of the spatial components 1874.

The sensor 1850 can be a detector that receives and senses the output spatial components 1874. For example, one type of suitable detector that can be used to measure along one dimension is a linear photodiode array. The linear photodiode array is consists of multiple elements of the same size, formed in a linear arrangement at an equal spacing in one package. The photodiode array is sensitive to the wavelength of the light beam 110', and if the light beam 110' has a wavelength in the deep ultraviolet range, then the photodiode array is sensitive to light having a wavelength in the deep ultraviolet range. As another example, the sensor 1850 can be a two dimensional sensor such as a two-dimensional charged coupled device (CCD) or a two-dimensional complementary metal oxide semiconductor (CMOS) sensor. The sensor 1850 should be able to read out data at a fast enough rate, for example, at about 6 kHz.

The control system 185 is connected to the output of the sensor 1850 as well as the optical source 105 and the spectral feature selection system 130 that is optically coupled to the pulsed light beam 110. The control system 185 measures a property of the spatial components 1874, and analyzes these measured properties to calculate an estimate of the spectral feature of the pulsed light beam 110. The control system 185 can perform the measurement, analysis, and calculation for each pulse of the light beam 110 or for a set of pulses of the light beam 110.

The property of the spatial components 1874 that is measured can be a scalar quantity (which is fully described by a magnitude or numerical value) alone or a vector quantity (which is fully described by both a magnitude and a direction). An example of a scalar property is a metric such as the width W of the optical spectrum 1872. In this example, it is possible that the entire shape of the optical spectrum 1872 is not known but the metric is known and this is used to estimate the shape of the optical spectrum 1872. An example of a vector property is the entire waveform that describes the optical spectrum 1872. In this example, one can calculate any metric from the entire spectrum and the by having the entire spectrum, one can make a more accurate calculation. The sensed spatial components can be measured for a range of one or more pulses of the pulsed light beam 110'.

The control system 185 can measure as the property the width W of the optical spectrum 1872. The width W of the optical spectrum 1872 can provide an estimate of the bandwidth (the spectral feature) of the light beam 110'. In some implementations, the width W of the optical spectrum 1872 is determined using a metric such as the FWXM (full width of the spectrum 1872 at a fraction X of the maximum peak intensity). In other implementations, the width W of the optical spectrum 1872 is determined using a metric such as EY (the width of the spectrum that contains a fraction Y of the integrated spectral intensity). Other metrics are suitable for measuring the property of the optical spectrum 1872.

Figure 19:
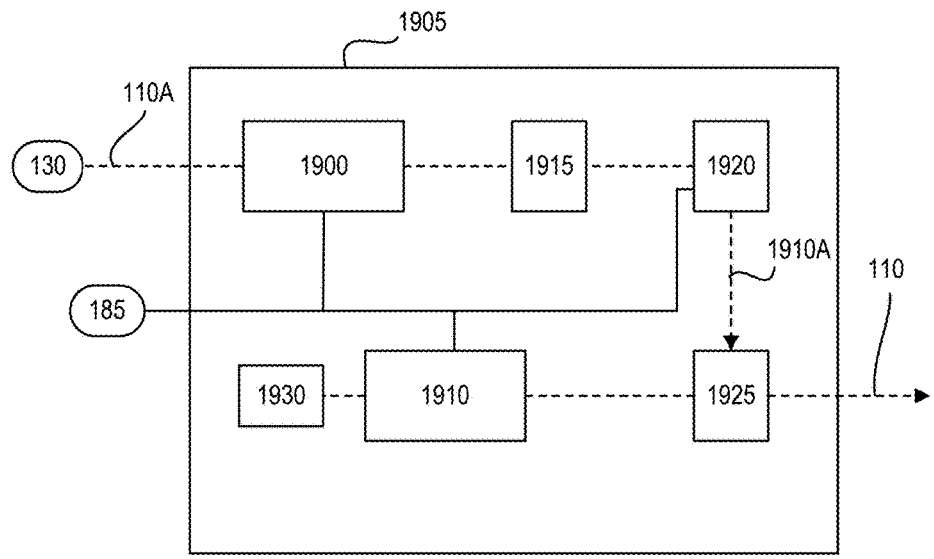
FIG. 19 is a block diagram of an exemplary optical source within the photolithography system of FIG. 1.

Referring to FIG. 19, in some implementations, the optical source 105 is an exemplary optical source 1905. The optical source 1905 is a pulsed laser source that produces a pulsed laser beam as the light beam 110. The optical source 1905 is a two-stage laser system that includes a master oscillator (MO) 1900 that provides the seed light beam 1910A to a power amplifier (PA) 1910. The master oscillator 1900 typically includes a gain medium in which amplification occurs and an optical feedback mechanism such as an optical resonator. The power amplifier 1910 typically includes a gain medium in which amplification occurs when seeded with the seed laser beam from the master oscillator 1900. The power amplifier 1910 can be a power ring amplifier (PRA), which is designed as a regenerative ring resonator. In this case, enough optical feedback can be provided from the ring design. The spectral feature selection apparatus 130 receives the light beam 110A from the master oscillator 1900 to enable fine tuning of spectral parameters such as the center wavelength and the bandwidth of the light beam 110A at relatively low output pulse energies. The power amplifier 1910 receives the light beam 1910A from the master oscillator 1900 and amplifies this output to attain the necessary power for output to use in photolithography.

In some implementations, the master oscillator 1900 includes a discharge chamber having two elongated electrodes, a laser gas that serves as the gain medium, and a fan circulating the gas between the electrodes. A laser resonator is formed between the spectral feature selection apparatus 130 on one side of the discharge chamber, and an output coupler 1915 on a second side of the discharge chamber to output the seed light beam 1910A to the power amplifier 1910.

In other implementations, the master oscillator 1900 includes as the gain medium, a solid state material. Solid state media that can be used include crystals or glasses doped with rare earth or transition metal ions, or semiconductor lasers. A master oscillator 1900 using a solid state gain medium generates the seed light beam 1910A. The solid state gain medium can be optically pumped with a flash lamp or an arc lamp, or using a laser diode or a titanium (Ti) sapphire (Ti:Sapphire) laser.

An exemplary solid state gain medium can be neodymium-doped yttrium aluminum garnet (Nd:YAG), neodymium doped yttrium lithium fluoride (Nd:YLF), or Ti:Sapphire. A solid state gain medium is capable of producing a single mode output, which is highly temporally (and spatially) coherent and also has a narrow bandwidth. The seed light beam 1910A that is output from the solid state gain medium of the master oscillator 1900 may be at a wavelength that is not the desired wavelength (for example, it could be outside of the DUV wavelength range). In this case, the seed light beam 1910A can be directed through one or more wavelength conversion elements in order to ensure that the wavelength of the seed light beam 1910A directed to the power amplifier 1910 is at the desired DUV wavelength. For example, if the seed light beam 1910A output from the solid state gain medium within the master oscillator 1900 is at a wavelength of about 773.6 nm (for example, as would be for a Ti:Sapphire gain medium), then the seed light beam 1910A could be directed through two wavelength conversion elements to convert the wavelength to about 193.4 nm. The wavelength conversion element or elements can use a non-linear optics technique, such as sum frequency generation, to convert the wavelength into the desired wavelength.

The high coherence properties of the solid state gain medium of the master oscillator 1900 can be addressed using the phase modulator system 145, which can be used to reduce the coherence (both temporal and spatial) of the seed light beam 1910A produced by such a master oscillator 1900. Moreover, the phase modulator system 145 also has the effect of increasing the bandwidth of the seed light beam 1910A; as the temporal coherence of the seed light beam 1910A is reduced, the bandwidth of the seed light beam 1910A is increased. Accordingly, the phase modulator system 145 can be used to both increase the bandwidth of the seed light beam 1910A and also to reduce the temporal coherence of the seed light beam 1910A.

The optical source 1905 can also include another spectral feature metrology module (such as a line center analysis module or LAM) 1920 that receives an output from the output coupler 1915, and one or more beam modification optical systems 1925 that modify the size and/or shape of the beam as needed. The spectral feature metrology module 1920 is a part of the metrology system 170, and is an example of one type of measurement system that can be used to measure the wavelength (for example, the center wavelength) of the seed light beam.

The power amplifier 1910 includes a power amplifier discharge chamber, and if it is a regenerative ring amplifier, the power amplifier also includes a beam reflector or beam turning device 1930 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 1910A is amplified by repeatedly passing through the power amplifier 1910. The beam modification optical system 1925 provides a way (for example, a partially-reflecting mirror) to in-couple the seed light beam 1910A and to out-couple a portion of the amplified radiation from the power amplifier to form the output light beam 110.

The laser gas used in the discharge chambers of the master oscillator 1900 and the power amplifier 1910 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The spectral feature metrology module 1920 monitors the wavelength of the output (the light beam 1910A) of the master oscillator 1900. The spectral feature metrology module 1920 can be placed at other locations within the optical source 1905, or it can be placed at the output of the optical source 1905.

The repetition rate of the pulses produced by the power amplifier 1910 is determined by the repetition rate at which the master oscillator 1900 is controlled by the control system 185, under the instructions from the controller 140 in the photolithography exposure apparatus 115. The repetition rate of the pulses output from the power amplifier 1910 is the repetition rate seen by the photolithography exposure apparatus 115.

As discussed above, it is possible to control the bandwidth both coarsely and finely using only optical elements. On the other hand, it is possible to control the bandwidth in a fine and narrow range, and rapidly, by controlling a differential timing between the activation of the electrodes within the master oscillator 1900 and the power amplifier 1910 while controlling the bandwidth in a coarse and wide range by adjusting the angle of a prism within the spectral feature selection system 130.

Referring to FIG. 20, in some implementations, the spectral feature selection apparatus 130 includes a set of optical features or components 2000, 2005, 2010, 2015, 2020 arranged to optically interact with the pulsed light beam 110A and a control module 2050 that includes electronics in the form of any combination of firmware and software. The optical components 2000, 2005, 2010, 2015, 2020 can be configured to provide a coarse spectral feature adjustment system; and, if the adjustment of such components is rapid enough, it can be configured to provide a fine spectral feature adjustment system. Although not shown in FIG. 20, it is possible for the spectral feature selection apparatus 130 to include other optical features or other non-optical features for providing fine spectral feature control.

The control module 2050 is connected to one or more actuation systems 2000A, 2005A, 2010A, 2015A, 2020A physically coupled to respective optical components 2000, 2005, 2010, 2015, 2020. The optical components of the apparatus 130 include a dispersive optical element 2000, which can be a grating, and a beam expander 2001 made of a set of refractive optical elements 2005, 2010, 2015, 2020, which can be prisms. The grating 2000 can be a reflective grating that is designed to disperse and reflect the light beam 110A; accordingly, the grating 2000 is made of a material that is suitable for interacting with a pulsed light beam 110A having a wavelength in the DUV range. Each of the prisms 2005, 2010, 2015, 2020 is a transmissive prism that acts to disperse and redirect the light beam 110A as it passes through the body of the prism. Each of the prisms can be made of a material (such as, for example, calcium fluoride) that permits the transmission of the wavelength of the light beam 110A. Although four refractive optical elements 2005, 2010, 2015, 2020 are shown, it is possible for fewer than four or more than four to be used in the beam expander 2001.

The pulsed light beam 110A enters the apparatus 130 through an aperture 2055, and then travels through the prism 2020, the prism 2010, and the prism 2005, in that order, prior to impinging upon a diffractive surface 2002 of the grating 2000. With each passing of the beam 110A through a consecutive prism 2020, 2015, 2010, 2005, the light beam 110A is optically magnified and redirected (refracted at an angle) toward the next optical component. The light beam 110A is diffracted and reflected from the grating 2000 back through the prism 2005, the prism 2010, the prism 2015, and the prism 2020, in that order, prior to passing through the aperture 2055 as the light beam 110A exits the apparatus 130. With each passing through the consecutive prisms 2005, 2010, 2015, 2020 from the grating 2000, the light beam 110A is optically compressed as it travels toward the aperture 2055.

The rotation of a prism (which can be any one of prisms 2005, 2010, 2015, 2020) of the beam expander 2001 changes an angle of incidence at which the light beam 110A impinges upon the entrance surface of that rotated prism. Moreover, two local optical qualities, namely, an optical magnification and a beam refraction angle, of the light beam 110A through that rotated prism are functions of the angle of incidence of the light beam 110A impinging upon the entrance surface of that rotated prism. The optical magnification of the light beam 110A through the prism is the ratio of a transverse width of the light beam 110A exiting that prism to a transverse width of the light beam 110A entering that prism.

A change in the local optical magnification of the light beam 110A at one or more of the prisms within the beam expander 2001 causes an overall change in the optical magnification OM 2065 of the light beam 110A through the beam expander 2001. The optical magnification OM 2065 of the light beam 110A through the beam expander 2001 is the ratio of the transverse width Wo of the light beam 110A exiting the beam expander 2001 to a transverse width Wi of the light beam 110A entering the beam expander 2001. Additionally, a change in the local beam refraction angle through one or more of the prisms within the beam expander 2001 causes an overall change in an angle of incidence of 2062 of the light beam 110A at the surface 2002 of the grating 2000.

The wavelength of the light beam 110A can be adjusted by changing the angle of incidence 2062 at which the light beam 110A impinges upon the diffractive surface 2002 of the grating 2000. The bandwidth of the light beam 110A can be adjusted by changing the optical magnification 2065 of the light beam 110.

The apparatus 130 is designed to adjust the wavelength of the light beam 110A that is produced within the resonator or resonators of the optical source 105 by adjusting an angle 2062 of incidence of at which the light beam 110A impinges upon the diffractive surface 2002 of the grating 2000. Specifically, this can be done by rotating one or more of the prisms 2005, 2010, 2015, 2020 and the grating 2000 to thereby adjust the angle of incidence 2062 of the light beam 110A.

Moreover, the bandwidth of the light beam 110A that is produced by the optical source 105 is adjusted by adjusting the optical magnification OM 2065 of the light beam 110A. Thus, the bandwidth of the light beam 110A can be adjusted by rotating one or more of the prisms 2005, 2010, 2015, 2020, which causes the optical magnification 2065 of the light beam 110A to change. Because the rotation of a particular prism causes a change in both the local beam refraction angle and the local optical magnification at that prism, the control of wavelength and bandwidth are coupled in this design.

Additionally, the bandwidth of the light beam 110A is relatively sensitive to the rotation of the prism 2020 and relatively insensitive to rotation of the prism 2005. This is because any change in the local optical magnification of the light beam 110A due to the rotation of the prism 2020 is multiplied by the product of the change in the optical magnification in the other prisms 2015, 2010, and 2005 because those prisms are between the rotated prism 2020 and the grating 2000, and the light beam 110A must travel through these other prisms 2015, 2010, 2005 after passing through the prism 2020. On the other hand, the wavelength of the light beam 110A is relatively sensitive to the rotation of the prism 2005 and relatively insensitive to the rotation of the prism 2020.

For example, in order to change the bandwidth without changing the wavelength, the optical magnification 2065 should be changed without changing the angle of incidence 2062, and this can be achieved by rotating the prism 2020 by a large amount and rotating the prism 2005 by a small amount.

The control module 2050 is connected to one or more actuation systems 2000A, 2005A, 2010A, 2015A, 2020A that are physically coupled to respective optical components 2000, 2005, 2010, 2015, 2020. Although an actuation system is shown for each of the optical components it is possible that some of the optical components in the apparatus 130 are either kept stationary or are not physically coupled to an actuation system. For example, in some implementations, the grating 2000 can be kept stationary and the prism 2015 can be kept stationary and not physically coupled to an actuation system.

Each of the actuation systems 2000A, 2005A, 2010A, 2015A, 2020A includes one or more actuators that are connected to its respective optical components. The adjustment of the optical components causes the adjustment in the particular spectral features (the wavelength and/or bandwidth) of the light beam 110A. The control module 2050 receives a control signal from the control system 185, the control signal including specific commands to operate or control one or more of the actuation systems. The actuation systems can be selected and designed to work cooperatively.

Each of the actuators of the actuation systems 2000A, 2005A, 2010A, 2015A, 2020A is a mechanical device for moving or controlling the respective optical component. The actuators receive energy from the module 2050, and convert that energy into some kind of motion imparted to the respective optical component. For example, the actuation systems can be any one of force devices and rotation stages for rotating one or more of prisms of a beam expander. The actuation systems can include, for example, motors such as stepper motors, valves, pressure-controlled devices, piezoelectric devices, linear motors, hydraulic actuators, voice coils, etc.

The grating 2000 can be a high blaze angle Echelle grating, and the light beam 110A incident on the grating 2000 at any angle of incidence 2062 that satisfies a grating equation will be reflected (diffracted). The grating equation provides the relationship between the spectral order of the grating 2000, the diffracted wavelength (the wavelength of the diffracted beam), the angle of incidence 2062 of the light beam 110A onto the grating 2000, the angle of exit of the light beam 110A diffracted off the grating 2000, the vertical divergence of the light beam 110A incident onto the grating 2000, and the groove spacing of the diffractive surface of the grating 2000. Moreover, if the grating 2000 is used such that the angle of incidence 2062 of the light beam 110A onto the grating 2000 is equal to the angle of exit of the light beam 110A from the grating 2000, then the grating 2000 and the beam expander (the prisms 2005, 2010, 2015, 2020) are arranged in a Littrow configuration and the wavelength of the light beam 110A reflected from the grating 2000 is the Littrow wavelength. It can be assumed that the vertical divergence of the light beam 110A incident onto the grating 2000 is near zero. To reflect the nominal wavelength, the grating 2000 is aligned, with respect to the light beam 110A incident onto the grating 2000, so that the nominal wavelength is reflected back through the beam expander (the prisms 2005, 2010, 2015, 2020) to be amplified in the optical source 105. The Littrow wavelength can then be tuned over the entire gain bandwidth of the resonators within optical source 105 by varying the angle of incidence 2062 of the light beam 110A onto the grating 2000.

Each of the prisms 2005, 2010, 2015, 2020 is wide enough along the transverse direction of the light beam 110A so that the light beam 110A is contained within the surface at which it passes. Each prism optically magnifies the light beam 110A on the path toward the grating 2000 from the aperture 2055, and therefore each prism is successively larger in size from the prism 2020 to the prism 2005. Thus, the prism 2005 is larger than the prism 2010, which is larger than the prism 2015, and the prism 2020 is the smallest prism.

As discussed above, the bandwidth of the light beam 110A is relatively sensitive to the rotation of the prism 2020 and relatively insensitive to rotation of the prism 2005. This is because any change in the local optical magnification of the light beam 110A due to the rotation of the prism 2020 is multiplied by the product of the change in the optical magnification in the other prisms 2015, 2010, and 2005 because those prisms are between the rotated prism 2020 and the grating 2000, and the light beam 110A must travel through these other prisms 2015, 2010, 2005 after passing through the prism 2020. On the other hand, the wavelength of the light beam 110A is relatively sensitive to the rotation of the prism 2005 and relatively insensitive to the rotation of the prism 2020. Thus, the wavelength can be coarsely changed by rotating the prism 2005, and the prism 2020 can be rotated (in a coarse manner). The angle of incidence 2062 of the light beam 110A is changed due to the rotation of the prism 2005 and the rotation of the prism 2020 offset the change in magnification caused by the rotation of the prism 2005. The prism 2020 can be used for coarse, large range, and slow bandwidth control. By contrast, the bandwidth can be controlled in a fine and narrow range and even more rapidly by controlling the prism 2010.

Figure 21:
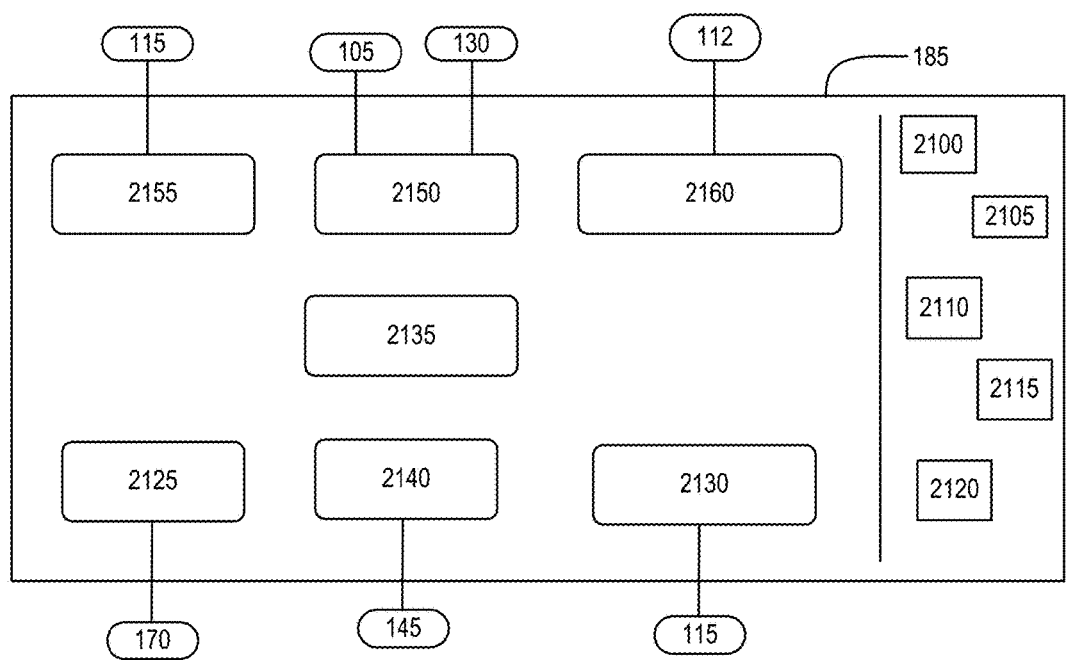
FIG. 21 is a block diagram of an exemplary control system within the photolithography system of FIG. 1.

Referring to FIG. 21, details about the control system 185 are provided that relate to the aspects of the system and method described herein. The control system 185 can include other features not shown in FIG. 21. In general, the control system 185 includes one or more of digital electronic circuitry, computer hardware, firmware, and software.

The control system 185 includes memory 2100, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 185 can also include one or more input devices 2105 (such as a keyboard, touch screen, microphone, mouse, hand-held input device, etc.) and one or more output devices 2110 (such as a speaker or a monitor).

The control system 185 includes one or more programmable processors 2115, and one or more computer program products 2120 tangibly embodied in a machine-readable storage device for execution by a programmable processor (such as the processors 2115). The one or more programmable processors 2115 can each execute a program of instructions to perform desired functions by operating on input data and generating appropriate output. Generally, the processor 2115 receives instructions and data from memory 2100. Any of the foregoing may be supplemented by, or incorporated in, specially designed ASICs (application-specific integrated circuits).

The control system 185 includes, among other components, a spectral feature analysis module 2125, a lithography analysis module 2130, a decision module 2135, a phase modulation module 2140, a light source actuation module 2150, a lithography actuation module 2155, and a beam preparation actuation module 2160. Each of these modules can be a set of computer program products executed by one or more processors such as the processors 2115. Moreover, any of the modules 2125, 2130, 2135, 2140, 2150, 2155, 2160 can access data stored within the memory 2100.

The spectral feature analysis module 2125 receives the output from the metrology system 170. The phase modulation module 2140 interfaces with the phase modulator system 145, to control the signal provided to the voltage source 1257 for controlling the electrodes 1248, 1249 of the phase modulator system 145. The lithography analysis module 2130 receives information from the lithography controller 140 of the photolithography exposure apparatus 115. The decision module 2135 receives the outputs from the analyses modules (such as the modules 2125 and 2130) and determines which actuation module or modules (such as the phase modulation module 2140 or the light source actuation module 2150) need to be activated based on the outputs from the analyses modules.

The light source actuation module 2150 is connected to one or more of the optical source 105 and the spectral feature selection apparatus 130. The lithography actuation module 2155 is connected to the photolithography exposure apparatus 115, and specifically to the lithography controller 140. The beam preparation actuation module 2160 is connected to one or more components of the beam preparation system 112. Connections between modules within the control system 185 and between modules within the control system 185 and other components of the photolithography system 100 can be wired or wireless.

While only a few modules are shown in FIG. 21, it is possible for the control system 185 to include other modules. Additionally, although the control system 185 is represented as a box in which all of the components appear to be co-located, it is possible for the control system 185 to be made up of components that are physically remote from each other. For example, the light source actuation module 2150 can be physically co-located with the optical source 105 or the spectral feature selection apparatus 130.

In general, the control system 185 receives at least some information about the light beam 110 from the metrology system 170, and the spectral feature analysis module 2125 performs an analysis on the information to determine how to adjust one or more spectral features (for example, the bandwidth) of the light beam 110 supplied to the photolithography exposure apparatus 115. Based on this determination, the control system 185 sends signals to the spectral feature selection apparatus 130 and/or the optical source 105 to control operation of the optical source 105 via the control module 2050. In general, the spectral feature analysis module 2125 performs the analysis needed to estimate one or more spectral features (for example, the wavelength and/or the bandwidth) of the light beam 110. The output of the spectral feature analysis module 2125 is an estimated value of the spectral feature that is sent to the decision module 2135.

The spectral feature analysis module 2125 includes a comparison block connected to receive the estimated spectral feature and also connected to receive a spectral feature target value. In general, the comparison block outputs a spectral feature error value that represents a difference between the spectral feature target value and the estimated value. The decision module 2135 receives the spectral feature error value and determines how best to effect a correction to the system 100 in order to adjust the spectral feature. Thus, the decision module 2135 sends a signal to the light source actuation module 2150, which determines how to adjust the spectral feature selection apparatus 130 (or the optical source 105) based on the spectral feature error value. The output of the light source actuation module 2150 includes a set of actuator commands that are sent to the spectral feature selection apparatus 130. For example, the light source actuation module 2150 sends the commands to the control module 2050, which is connected to the actuation systems within the exemplary apparatus 130 shown in FIG. 20.

Additionally, the lithography analysis module 2130 can receive instructions from the lithography controller 140 of the photolithography exposure apparatus 115 for example, to change one or more spectral features of the pulsed light beam 110 or to change a pulse repetition rate of the light beam 110. The lithography analysis module 2130 performs an analysis on these instructions to determine how to adjust the spectral features and sends the results of the analysis to the decision module 2135. The control system 185 causes the optical source 105 to operate at a given repetition rate, which is the rate at which the pulses are produced. More specifically, the photolithography exposure apparatus 115 sends a trigger signal to the optical source 105 (by way of the control system (through the lithography analysis module 2130) for every pulse (that is, on a pulse-to-pulse basis) and the time interval between those trigger signals can be arbitrary, but when the photolithography exposure apparatus 115 sends trigger signals at regular intervals then the rate of those signals is a repetition rate. The repetition rate can be a rate requested by the photolithography exposure apparatus 115.

The phase modulation module 2140 can receive instructions (for example, from the decision module 2135) on how to modify the signal provided to the voltage source 1257 for controlling the electrodes 1248, 1249 of the phase modulator system 145. By adjusting the signal provided to the voltage source 1257, the frequency of modulation of the optical phase of the pulse is adjusted.

Figure 22:
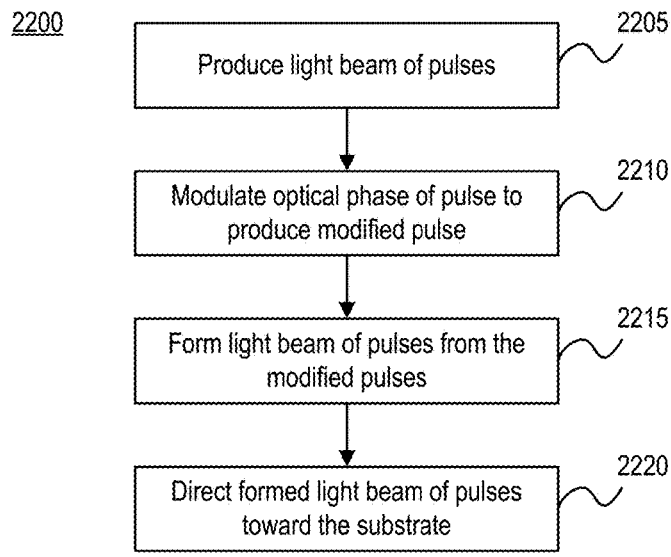
FIG. 22 is a flow chart of an exemplary procedure performed by the photolithography system for reducing a temporal coherence of pulses of the light beam.

Referring to FIG. 22, a procedure 2200 is performed by the photolithography system 100. The light beam 110 made up of pulses is produced (2205). Each pulse has a wavelength in the deep ultraviolet range, and each pulse having a first temporal coherence defined by a first temporal coherence length. Each pulse is defined by a pulse duration. The pulse duration can be defined as the time during which the power of the pulse remains continuously above a percentage (for example a half) of its maximum value.

For one or more of these pulses, the optical phase of the pulse is modulated over the pulse duration of the pulse to produce a modified pulse (2210). The modified pulse has a second temporal coherence defined by a second temporal coherence length that is less than the first temporal coherence length of the pulse (that is, the unmodified pulse). For example, the optical phase is modulated over the pulse duration of a pulse to produce the modified pulse (2210) by convoluting the spectrum of the electric field of the pulse by a Fourier transform relating to modulating the optical phase over the pulse duration of the pulse.

The optical phase of the pulse can be modulated (2210) by modulating a refractive index of a material through which the pulse is directed. For example, the optical phase of the pulse 1205 is modulated by modulating the refractive index of the electro-optic crystal 1247 through which the pulse 1205 propagates. The optical phase can be modulated at frequencies that lie within a frequency range.

The optical phase of the pulse can be modulated (2210) by randomizing the optical phase over the pulse duration of the pulse. The optical phase of the pulse can be modulated (2210) by changing the position of points in time on the electric waveform of the pulse.

The optical pulse is associated with a waveform, the waveform being represented by points in time, and the optical phase of the pulse can be modulated (2210) by applying a different temporal delay to different points of the waveform. The different temporal delay is applied to different points of the waveform by passing the optical pulse through a medium (or material such as the electro-optic crystal 1247) and varying an index of refraction of the medium as the pulse passes through the medium. The amplitude of the modulation of the optical phase can vary randomly over the pulse duration of the pulse.

A light beam of pulses is formed from one or more of the modified pulses (2215), and the formed light beam of pulses is directed toward the wafer 120 within the photolithography exposure apparatus 115 (2220).

The optical phase is modulated (2210) over the pulse duration of a pulse to produce the modified pulse to thereby reduce a dynamic speckle (which is also referred to as dynamic speckle contrast) of the light beam of pulses directed toward the substrate.

The light beam made up of pulses can be produced by producing a seed light beam 1910A made up of pulses. The light beam 110 made up of amplified pulses can be produced by optically amplifying the pulses of the seed light beam 1910A by repeatedly passing the pulses of the seed light beam through a resonator (for example, within the power amplifier 1910). The optical phase can be modulated over the pulse duration of a pulse by modulating the optical phase over the pulse duration of an amplified pulse to produce the modified pulse. The optical phase can be modulated over the pulse duration of a pulse by modulating the optical phase over the pulse duration of a pulse of the seed light beam 1910A to produce the modified pulse. The light beam 110 made up of amplified pulses can be produced by optically amplifying the modified pulses.

The procedure 2200 can also include reducing a bandwidth of the pulses of the light beam before modulating the optical phase over the pulse duration of each pulse to produce the modified pulse. Modulating the optical phase over the pulse duration of a pulse causes the bandwidth of the pulse to increase but remain below a target bandwidth. This phenomenon (in which the bandwidth of the modified pulse increases as the frequency of the optical phase modulation is increased) can be used to adjust the bandwidth of the pulse that is directed toward the wafer 120 by adjusting the rate or frequency with which the optical phase of that pulse is modulated.

The procedure 2200 can also include increasing a duration of the pulses in the light beam that are directed toward the wafer 120. The duration of the pulses in the light beam directed toward the wafer 120 can be increased by: splitting the amplitude of each pulse of the light beam into split portions, introducing temporal delays among these split portions to produce temporally-delayed portions of the pulse, and then recombining these temporally-delayed portions of the pulse to provide a temporally stretched pulse of the light beam. Moreover, the optical phase can be modulated (2210) over the pulse duration of a pulse to produce the modified pulse by modulating the optical phase over the pulse duration of one or more split portions of the pulse.

Figure 23:
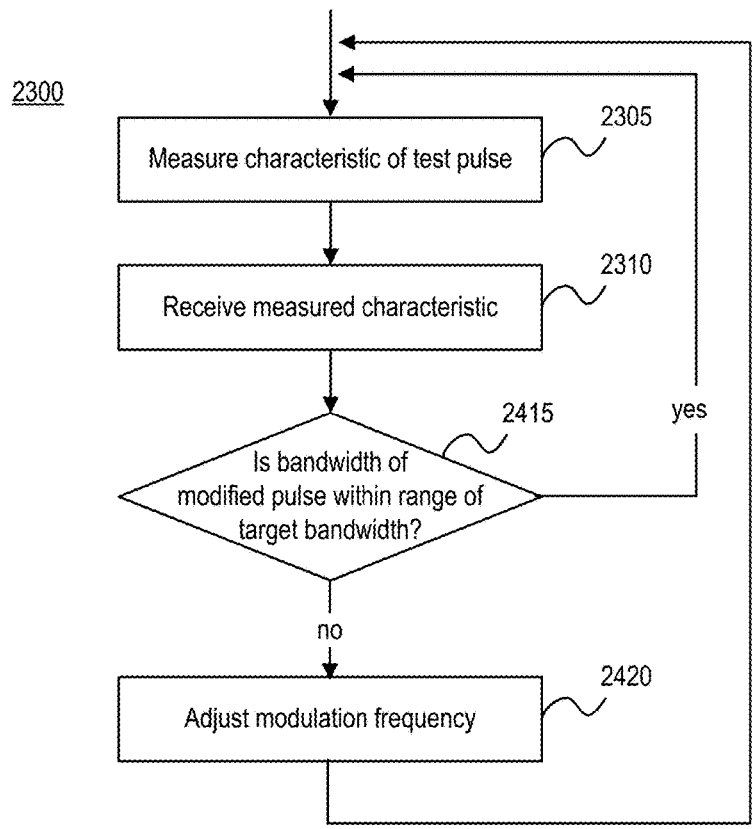
FIG. 23 is a flow chart of an exemplary procedure performed by the photolithography system for selecting a frequency range at which the optical phase over the pulse duration of a pulse is modulated to thereby reduce the temporal coherence of the pulse.

The bandwidth of the modified pulse of the light beam can be greater than the bandwidth of the pulse of the light beam prior to modulation. Referring also to FIG. 23, the procedure 2200 can also include an additional procedure 2300 for selecting a frequency range at which the optical phase over the pulse duration of a pulse is modulated. Basically, the procedure 2300 operates on the principle that the modulation frequencies (or the maximum allowed modulation frequency) can be selected by determining target modulation frequencies that would produce a bandwidth that is within a range of a target bandwidth of the modified pulse; and then maintaining the maximum allowed modulation frequency below the determined target modulation frequency to thereby ensure that the modulation frequencies are within the target modulation frequencies and to thereby maintain the bandwidth of the modified pulse within a range of the target bandwidth. The procedure 2300 includes measuring a characteristic of a test pulse (2305). A test pulse is either the pulse having the first temporal coherence (prior to being modulated) or the modified pulse having the second temporal coherence. The characteristic of the test pulse that is measured can be a bandwidth of the test pulse. The measured characteristic is received (2310) and the control system 185 determines whether the bandwidth of the modified pulse is within a range of the target bandwidth based on the received characteristic (2315). If the control system 185 determines that the bandwidth of the modified pulse is outside the range of the target bandwidth, then the maximum allowed frequency at which the optical phase is modulated is adjusted (2320). By adjusting the maximum allowed frequency at which the optical phase is modulated, it is thereby possible to adjust the bandwidth of the modified pulse. For example, the phase modulation module 2140 could adjust the control signal provided to the voltage source 1257 of the phase modulator system 145 to adjust the maximum allowed frequency of modulation. And, the control signal can be adjusted by adjusting a signal filter through which the control signal is directed.

The procedure 2300 can be performed for each pulse of the light beam 110.

Other implementations are within the scope of the following claims.

What is claimed is:

1. A method comprising:
producing a light beam made up of pulses having a wavelength in a deep ultraviolet range, each pulse having a first temporal coherence defined by a first temporal coherence length and each pulse being defined by a pulse duration;
for each pulse in a plurality of pulses in the light beam, modulating an optical phase over the pulse duration of the pulse to produce a modified pulse having a second temporal coherence defined by a second temporal coherence length that is less than the first temporal coherence length of the pulse;
forming a light beam of pulses at least from the produced modified pulses; and
directing the formed light beam of pulses toward a substrate within a lithography exposure apparatus.

2. The method of claim 1, wherein producing the light beam made up of pulses comprises:
producing a seed light beam made up of pulses; and
producing a light beam made up of amplified pulses by optically amplifying the pulses of the seed light beam by repeatedly passing the pulses of the seed light beam through a resonator.

3. The method of claim 2, wherein modulating the optical phase over the pulse duration of the pulse comprises modulating the optical phase over a pulse duration of an amplified pulse to produce the modified pulse.

4. The method of claim 2, wherein:
modulating the optical phase over the pulse duration of the pulse comprises modulating the optical phase over a pulse duration of a pulse of the seed light beam to produce the modified pulse; and
producing the light beam made up of amplified pulses comprises optically amplifying the modified pulses.

5. The method of claim 4, wherein directing the light beam of pulses formed from the modified pulses toward the substrate comprises directing the light beam made up of amplified pulses toward the substrate.

6. The method of claim 1, further comprising reducing a bandwidth of a pulse of the light beam before modulating the optical phase over the pulse duration of that pulse to produce the modified pulse,
wherein modulating the optical phase over the pulse duration of the pulse causes the bandwidth of the pulse to increase but remain within a range of a target bandwidth.

7. The method of claim 1, wherein modulating the optical phase over the pulse duration of a pulse to produce the modified pulse comprises convoluting the spectrum of an electric field of the pulse by a Fourier transform relating to modulating the optical phase over the pulse duration of the pulse.

8. The method of claim 1, wherein modulating the optical phase over the pulse duration of a pulse to produce the modified pulse thereby reduces a dynamic speckle contrast of the light beam of pulses directed toward the substrate.

9. The method of claim 1, further comprising increasing a duration of the pulses in the light beam directed toward the substrate,
wherein increasing the duration of the pulses in the light beam directed toward the substrate comprises:
splitting the amplitude of each pulse of the light beam into split portions,
introducing temporal delays among these split portions to produce temporally-delayed portions of the pulse, and
then recombining these temporally-delayed portions of the pulse to provide a temporally stretched pulse of the light beam.

10. The method of claim 9, wherein modulating the optical phase over the pulse duration of a pulse to produce the modified pulse comprises modulating the optical phase over the pulse duration of one or more split portions of the pulse.

11. The method of claim 1, wherein modulating the optical phase over the pulse duration of the pulse causes a bandwidth of the pulse of the light beam to increase.

12. The method of claim 1, further comprising selecting a range of frequencies at which the optical phase over the pulse duration of the pulse is modulated, wherein selecting the frequency range comprises:
   determining a target frequency range that would produce a target bandwidth of the modified pulse; and
   maintaining the frequency range within the determined target frequency range to thereby maintain the bandwidth of the modified pulse within a range of the target bandwidth.

13. The method of claim 12, further comprising measuring a bandwidth of the pulse prior to modulating the optical phase over the pulse duration of the pulse to determine whether the modified pulse would have a bandwidth that is within a range of the target bandwidth.

14. The method of claim 12, further comprising measuring a bandwidth of the modified pulse prior to modulating the optical phase over the pulse duration of the next pulse to determine whether the modified pulse has a bandwidth that is within a range of the target bandwidth.

15. The method of claim 14, further comprising calculating the target bandwidth for a particular next pulse based on the measured bandwidth of a plurality of previously-modified pulses.

16. The method of claim 12, wherein selecting the frequency range at which the optical phase over the pulse duration of a pulse is modulated comprises selecting the frequency range at which the optical phase over the pulse duration of a pulse is modulated for each pulse in the light beam.

17. The method of claim 1, wherein modulating the optical phase over the pulse duration of the pulse to produce the modified pulse comprises modulating a refractive index of a material through which the pulse is directed.

18. The method of claim 1, further comprising adjusting a bandwidth of the pulse that is directed toward the substrate by adjusting a rate at which the optical phase is modulated.

19. The method of claim 1, wherein modulating the optical phase over the pulse duration of the pulse to produce the modified pulse having the second temporal coherence defined by the second temporal coherence length that is less than the first temporal coherence length of the pulse for each pulse in the plurality of pulses in the light beam comprises modulating the optical phase over the pulse duration of the pulse to produce the modified pulse having the second temporal coherence defined by the second temporal coherence length that is less than the first temporal coherence length of the pulse for each pulse in the light beam.

20. The method of claim 1, further comprising:
   estimating a bandwidth of the modified pulse;
   determining whether the estimated bandwidth is within a range of a target bandwidth; and
   if it is determined that the estimated bandwidth is outside the range of a target bandwidth, then adjusting a frequency range at which the optical phase is modulated to thereby adjust a bandwidth of the next modified pulse.

21. The method of claim 1, wherein modulating the optical phase over the pulse duration of a pulse comprises randomizing the optical phase over the pulse duration of the pulse.

22. The method of claim 1, wherein the optical pulse is associated with a waveform, the waveform being represented by points in time, and modulating the optical phase over the pulse duration of a pulse comprises applying a different temporal delay to different points of the waveform.

23. The method of claim 22, wherein applying a different temporal delay to different points of the waveform comprises passing the optical pulse through a medium and varying an index of refraction of the medium as the pulse passes through the medium.

24. The method of claim 1, wherein an amplitude of the modulation varies randomly over the pulse duration of the pulse.

25. The method of claim 1, wherein an amplitude of the modulation varies in a manner that reduces one or more of dynamic speckle and bandwidth of the light beam of pulses directed toward the substrate.

26. The method of claim 1, wherein each pulse has a first spatial coherence defined by a first spatial coherence length, the method further comprising reducing a spatial coherence of the pulse as it is being modulated such that the modified pulse has a second spatial coherence defined by a second spatial coherence length that is less than the first spatial coherence length of the pulse.

27. An apparatus comprising:
   a light source configured to produce a light beam made up of pulses having a wavelength in a deep ultraviolet range, each pulse having a first temporal coherence defined by a first temporal coherence length and each pulse being defined by a pulse duration;
   a phase modulator system in a path of the light beam of pulses, configured to, for each pulse in a plurality of pulses in the light beam, modulate an optical phase over the pulse duration of the pulse to produce a modified pulse having a second temporal coherence defined by a second temporal coherence length that is less than the first temporal coherence length;
   a measurement apparatus configured to measure a characteristic of a test pulse, wherein the test pulse is either a pulse having the first temporal coherence or the modified pulse having the second temporal coherence; and
   a control system in communication with the measurement apparatus and the phase modulator system, the control system configured to:
      receive the measured characteristic of the test pulse from the measurement apparatus;
      determine whether a bandwidth of the modified pulse is within a range of a target bandwidth based on the received measured characteristic; and
      if it is determined that the bandwidth of the modified pulse is outside the range of the target bandwidth, then adjust a frequency at which the optical phase over the pulse duration of the pulse that produces the modified pulse is modulated.

28. The apparatus of claim 27, further comprising a beam directing apparatus in the path of a light beam of pulses formed from the modified pulses, the beam directing apparatus configured to direct the light beam of pulses formed from the modified pulses toward a substrate within a lithography exposure apparatus;
   wherein the phase modulator system is within the lithography exposure apparatus.

29. The apparatus of claim 28, wherein the phase modulator system includes a two-dimensional array of phase modulators positioned within a beam homogenizer.

30. The apparatus of claim 29, wherein the two-dimensional array of phase modulators is also configured to, for each pulse, reduce a spatial coherence of the pulse so that the modified pulse has a second spatial coherence that is less than the spatial coherence of the pulse.

31. The apparatus of claim 27, wherein the light source comprises:
   a first stage light source configured to produce a seed light beam made up of pulses and including a spectral tuning apparatus for tuning one or more spectral features of the seed light beam, and
   a second stage optical amplifier having a resonator with a gain medium, the optical amplifier configured to receive the pulses of the seed light beam and produce a light beam made up of amplified pulses.

32. The apparatus of claim 31, wherein the first stage light source configured to produce the seed light beam made up of pulses includes a solid state gain medium.

33. The apparatus of claim 31, wherein the phase modulator system is between the first stage light source and the second stage optical amplifier.

34. The apparatus of claim 27, wherein the test pulse is a modified pulse.

35. The apparatus of claim 27, wherein the control system is also in communication with the light source, and the control system is configured to, if it is determined that the bandwidth of the modified pulse falls outside the target bandwidth range, send a signal to the light source to adjust a bandwidth of the pulses.

36. The apparatus of claim 27, wherein the characteristic of the test pulse that is measured by the measurement apparatus is a bandwidth of the test pulse.

37. The apparatus of claim 27, further comprising an optical temporal pulse stretcher configured to increase a duration of the modified pulses.

38. The apparatus of claim 37, wherein the optical temporal pulse stretcher is a passive optical element.

39. The apparatus of claim 27, wherein:
   the phase modulator system includes a Pockels cell including a medium through which the light beam of pulses passes; and
   modulating the optical phase over the pulse duration of the pulse comprises modulating an index of refraction of the medium of the Pockels cell.

40. The apparatus of claim 27, wherein the phase modulator system includes a single phase modulator.

41. The apparatus of claim 27, wherein the phase modulator system is configured to, for each pulse in the light beam, modulate the optical phase over the pulse duration of the pulse to produce the modified pulse having the second temporal coherence defined by the second temporal coherence length that is less than the first temporal coherence length.

42. An apparatus comprising:
   a phase modulator system in a path of a light beam of pulses having a wavelength in a deep ultraviolet range, the phase modulator system is configured to, for each pulse in a plurality of pulses of the light beam, modulate an optical phase over a pulse duration of the pulse to produce a modified pulse having a second temporal coherence length that is less than a first temporal coherence length of the pulse before it has been modulated;
   a measurement apparatus configured to measure a characteristic of a test pulse, wherein the test pulse is either a pulse having the first temporal coherence or the modified pulse having the second temporal coherence; and
   a control system in communication with the measurement apparatus and the phase modulator system, the control system configured to:
      receive the measured characteristic of the test pulse from the measurement apparatus;
      determine whether a bandwidth of the modified pulse is within a range of a target bandwidth based on the received measured characteristic; and
      if it is determined that the bandwidth of the modified pulse is outside the range of the target bandwidth, then adjust a frequency at which the optical phase over the pulse duration of the pulse that produces the modified pulse is modulated.

\* \* \* \* \*

UNITED STATES PATENT AND TRADEMARK OFFICE
CERTIFICATE OF CORRECTION

PATENT NO. : 10,451,890 B2
APPLICATION NO. : 15/407153
DATED : October 22, 2019
INVENTOR(S) : Wilhelmus Patrick Elisabeth Maria op 't Root et al.

Page 1 of 1

It is certified that error appears in the above-identified patent and that said Letters Patent is hereby corrected as shown below:

On the Title Page

Item (73) Assignee should read:
--(73) Assignee: Cymer, LLC, San Diego, CA (US)
　　　　　　　　ASML Netherlands B.V., Veldhoven (NL)--.

In the Drawings

In Figure 23, reference numeral "2415" should read --2315--; and
　　　Reference numeral "2420" should read --2320--.

Signed and Sealed this
Twenty-eighth Day of April, 2020

Andrei Iancu
*Director of the United States Patent and Trademark Office*